(12) United States Patent
Floyd

(10) Patent No.: US 8,350,599 B2
(45) Date of Patent: Jan. 8, 2013

(54) VOLTAGE COMPARATORS

(75) Inventor: Brian Harold Floyd, Sunnyvale, CA (US)

(73) Assignee: Aptus Power Semiconductors, Los Altos, CA (US)

( * ) Notice: Subject to any disclaimer, the term of this patent is extended or adjusted under 35 U.S.C. 154(b) by 139 days.

(21) Appl. No.: 13/051,808

(22) Filed: Mar. 18, 2011

(65) Prior Publication Data

US 2011/0227608 A1 Sep. 22, 2011

Related U.S. Application Data

(60) Provisional application No. 61/315,203, filed on Mar. 18, 2010.

(51) Int. Cl.
*H03K 5/22* (2006.01)

(52) U.S. Cl. .............. 327/71; 327/63; 327/69; 327/70

(58) Field of Classification Search .............. 327/63, 327/66, 68–71
See application file for complete search history.

(56) References Cited

U.S. PATENT DOCUMENTS

| | | | | |
|---|---|---|---|---|
| 6,028,457 A | * | 2/2000 | Tihanyi | 327/77 |
| 6,133,764 A | * | 10/2000 | Griffith et al. | 327/65 |
| 7,315,187 B2 | * | 1/2008 | Laulanet et al. | 327/66 |
| 7,626,427 B2 | * | 12/2009 | Gruber et al. | 327/81 |
| 2011/0163796 A1 | * | 7/2011 | Floyd | 327/536 |

* cited by examiner

*Primary Examiner* — Patrick O'Neill
(74) *Attorney, Agent, or Firm* — Venture Pacific Law, PC

(57) ABSTRACT

A voltage comparator, comprises: a first branch comprising a first transistor, a first resistor (R1), and a first current dependent voltage source (VA), wherein a first voltage (V1) is applied across the first branch to generate a first current and wherein the first transistor is a diode-connected transistor; a second branch comprising a second resistor (R2), a second current dependent voltage source (VB), and a second transistor having a control voltage (V3), wherein a second voltage (V2) is applied on an end of the second branch to generate a second current; and a third branch for generating a comparator output, wherein a trip point of the comparator output is set to when the first current and the second current are equal and wherein the trip point is a function of the transistors, the resistors, and the current dependent voltage sources of the first branch and the second branch.

17 Claims, 25 Drawing Sheets

VOLTAGE COMPARATORS

CROSS REFERENCE

This application claims priority from a provisional patent application entitled "An N/M-times voltage-rail comparator for positive charge-pump systems" filed on Mar. 18, 2010 and having an Application No. 61/315,203, and a nonprovisional patent application entitled "A Load Switch System Driven by a Charge Pump" filed on Jan. 6, 2011 and having an application Ser. No. 12/986,155. Said applications are incorporated herein by reference.

FIELD OF INVENTION

The invention relates to electronic circuits and, in particular, to voltage comparators.

BACKGROUND

Generally, a comparator is a circuit that compares two voltages and outputs a signal indicating a result of the comparison. Comparators have many different applications. For instance, comparators are commonly utilized in pulse generators, square-wave generators, triangular-wave generators, pulse-width modulators, level detectors, zero-crossing detectors, pulse generators, line receivers, limit comparators, voltage-controlled oscillators, A/D converters, time delay generators, and other circuits.

One common circuit utilized to implement a comparator is a differential amplifier, which provides a high output when one of the two signals is higher and a low output when the other of the two signals is higher. One of the inputs to the differential amplifier is usually a reference voltage. The other input comprises a signal which is compared to the reference voltage, so as to obtain an indication as to which of the two inputs to the differential amplifier is larger in magnitude.

An important characteristic of a comparator is the response time or propagation delay introduced thereby. The response time can be defined as the time between the input voltage transition and some specified point on the output voltage transition. An accurately defined trip point and process dependent parameters of the comparator are also very important considerations in utilizing the comparator. Furthermore, it is sometimes desirable to compare a signal to more than one signal. It is certainly possible to construct a multi-input comparator circuit using a plurality of contemporary comparators or the like. This may be accomplished simply by using a first comparator to compare the two reference voltages to determine the higher voltage, then switching the highest reference voltage to the second comparator to compare the highest reference voltage to another signal. Alternatively, a signal can be compared to one reference voltage on a first comparator while simultaneously comparing the same signal to a second reference voltage on a second comparator, then applying logic gates to determine whether or not the signal is greater than both reference voltages.

However, to do so with contemporary devices inherently results in at least a doubling of the propagation delay. In some applications, such a propagation delay is not desirable. Furthermore, more sophisticated comparison of one input voltage to two or more other voltages cannot be accomplished using typical methods. For instance, comparing a voltage V2 with two other voltages V1 and V3, where the trip point of the comparator is a multiple of V1 summed with V3 is not possible using a basic combination of traditional comparators.

In view of the foregoing, it is desirable to provide a comparator for comparing a signal to one or more other voltages, where the comparator mitigates propagation delay, has a fast response time. Furthermore, it is desirable for providing a comparator that has a well defined trip point that is not process dependent.

SUMMARY OF INVENTION

An object of this invention is to provide methods and circuits for voltage comparators that can compare a voltage to a multiple of one or more other voltages (where such a comparator can be herein referred to as an N/M comparator).

Another object of this invention is to provide methods and circuits for voltage comparators that are not dependent on process parameters or temperature changes over a range of working conditions.

Yet another object of this invention is to provide methods and circuits for voltage comparators that are efficient, fast, and highly consistent in its operation, while using relatively few transistors.

Even more so, an object of this invention is to provide methods and circuits for voltage comparators, where trip-point thresholds depend upon respective resistor values and input voltages of the voltage comparators.

Briefly, the present invention discloses a voltage comparator, comprising: a first branch comprising a first transistor, a first resistor (R1), and a first current dependent voltage source (VA), wherein a first voltage (V1) is applied across the first branch to generate a first current and wherein the first transistor is a diode-connected transistor; a second branch comprising a second resistor (R2), a second current dependent voltage source (VB), and a second transistor having a control voltage (V3), wherein a second voltage (V2) is applied on an end of the second branch to generate a second current; and a third branch for generating a comparator output, wherein a trip point of the comparator output is set to when the first current and the second current are equal and wherein the trip point is a function of the transistors, the resistors, and the current dependent voltage sources of the first branch and the second branch. An advantage of this invention is that methods and circuits are provided for voltage comparators that can compare a voltage to a multiple of one or more other voltages.

Another advantage of this invention is that methods and circuits are provided for voltage comparators that are not dependent on process parameters or temperature changes over a range of working conditions.

Yet another advantage of this invention is that methods and circuits are provided for voltage comparators that are efficient, fast, and highly consistent in its operation, while using relatively few transistors.

Even more so, an advantage of this invention is that methods and circuits for voltage comparators are provided, where trip-point thresholds depend upon respective resistor values and input voltages of the voltage comparators.

DESCRIPTION OF THE DRAWINGS

The foregoing and other objects, aspects, and advantages of the invention can be better understood from the following detailed description of the preferred embodiment of the invention when taken in conjunction with the accompanying drawings in which.

DETAILED DESCRIPTION OF THE PREFERRED EMBODIMENTS

The following circuit diagrams for comparators of the present invention can be understood by a person having ordinary skill in the art, e.g., an electrical engineer who designs integrated circuits using common-practiced techniques including hierarchical circuit design with schematic-entry tools.

Generally, an N/M comparator of the present invention can compare multiple voltages (e.g., two voltages V1 and V2, three voltages V1, V2, and V3, or any number of other voltages), where N/M is a scale factor. A comparator of the present invention can also be well suited to be used in a charge-pump load-switch system. An example of a load switch system can be found in the nonprovisional patent application entitled "A Load Switch System Driven by a Charge Pump" filed on Jan. 6, 2011 and having an application Ser. No. 12/986,155 (herein referred to as the "Load Switch System"). In the Load Switch System, there are three voltages to consider regarding the N-channel load switch, including a drain voltage of the load switch; a gate voltage of the load switch; and a source voltage of the load switch. Given these voltages, an N/M comparator of the present invention can compare the relationship between these three voltages. Furthermore, the N/M comparator of the present invention can be better understood by the following figures.

Figure 1:
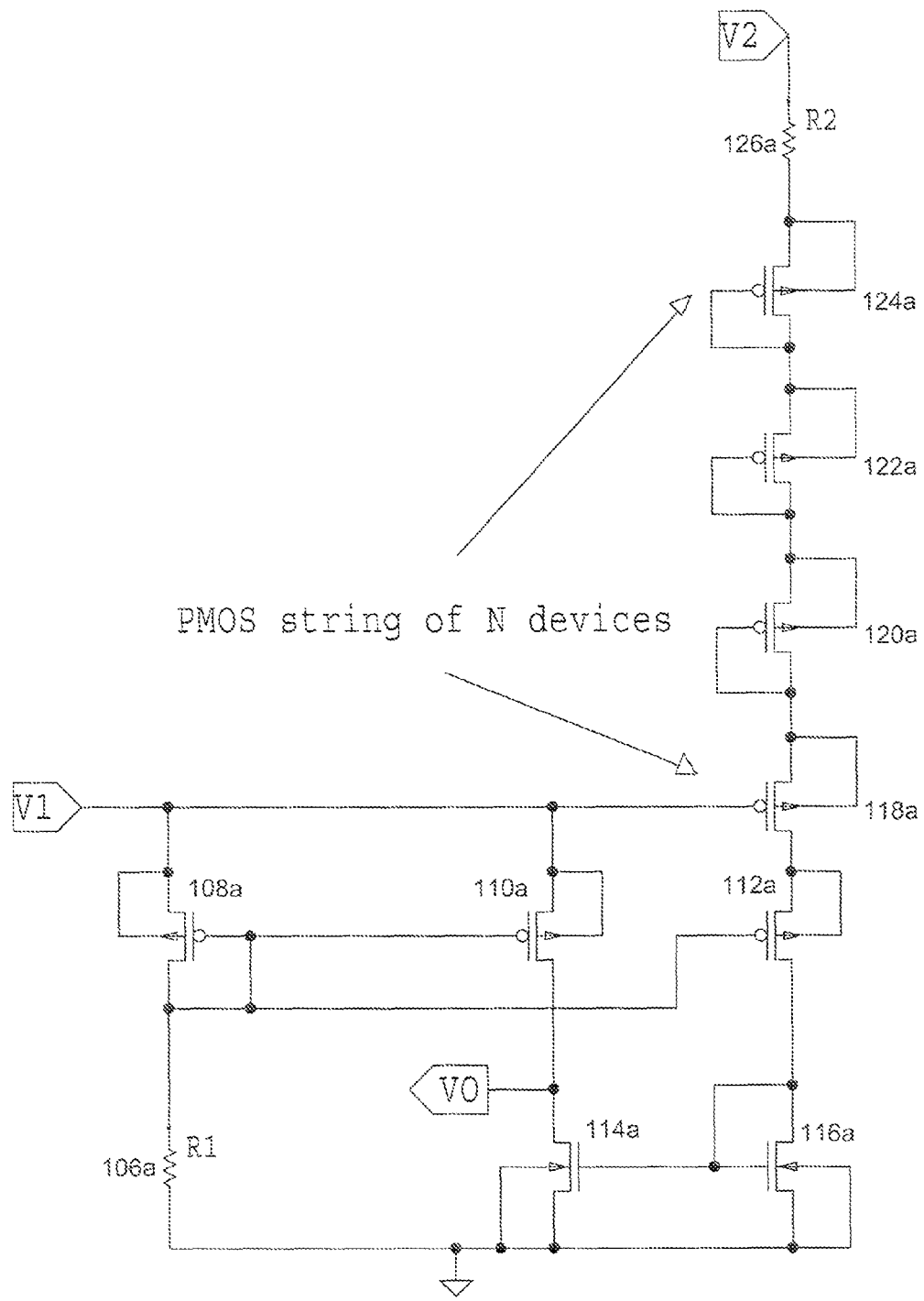
FIG. 1 illustrates a circuit diagram of a comparator of the present invention for comparing a multiple of a voltage V2 to another voltage V1.

FIG. 1 illustrates a circuit diagram of a comparator of the present invention for comparing a multiple of a voltage V2 to another voltage V1. The body-connected source of a PMOS 108a is connected to the voltage V1 while its gate and drain are both connected to one end of a resistor R1 106a. The other end of the resistor R1 106a is connected to ground. The PMOS 108a and a PMOS 110a form a current mirror, and the drain of the PMOS 110a is connected to an output voltage VO. The body-connected source of an NMOS 116a is connected to ground while its gate and drain are both connected to the drain of a PMOS 112a. The NMOS 116a and an NMOS 114a form a current mirror. The drain of the NMOS 114a is connected to the drain of the PMOS 110a. The output voltage VO is present at the connection of the two current mirrors. The body-connected source of the PMOS 112a is connected to the drain of a PMOS 118a, and the PMOS 112a is matched to the PMOS 110a and the PMOS 108a. The PMOS's 118a, 120a, 122a, and 124a form a string of matched devices connected in series. In general, any number, N, of PMOS devices may be connected in series as needed.

Each PMOS from this set of devices 118a, 120a, 122a, and 124a, can have its body connected to its source. The gate of the PMOS 118a is connected to the voltage V1 and its body-connected source is connected to the drain and gate of the PMOS 120a. The remaining PMOS devices 120a, 122a, and 124a are connected in series. The gate and drain of the PMOS 122a is connected to the body-connected source of the PMOS 120a and so on along the series of PMOS's until the final PMOS 124a. The body-connected source of PMOS 124a is connected to a resistor R2 126a. The other end of the resistor R2 is connected to the voltage V2.

The trip point can be set at $$V2=(N+1)V1, \quad (1)$$

where N can be an integer. If there are N PMOS devices present in the string and the voltage V2 equals (N+1) multiplied with V1, the output voltage VO will transition states (e.g., high to low) assuming the following: the resistance of the resistor R2 126a is matched to N times the resistance of the resistor R1 106a; the PMOS devices 108a, 110a, and 112a are matched devices of equal size; the NMOS devices 114a and 116a are also matched devices of equal size, forming a current mirror; and the N drawn PMOS devices (beginning with PMOS 118a) are matched and equal in size to the PMOS 108a. Here, there are four PMOS devices 118a-124a. Thus, N is equal to four and the trip point is five times V1. A goal of the design of the present invention is to cause gate-source potentials ("VGS") of the PMOS drawn devices (beginning with PMOS 118a) to match that of the gate-source potential of the PMOS 108a at the trip-point condition. In this manner and with the appropriate scaling of resistors R2 126a and R1

106a, the condition or trip point for a transition of the output voltage VO will be independent of the VGS and process parameters. This general technique for building a comparator is very convenient for the Load Switch System and other circuits.

The comparator's trip point is determined by the condition that the drain current of the NMOS 114a is equal to the drain current of the PMOS 110a. In theory, the trip point of the comparator can be determined by Equation (1) when the PMOS's are matched, the NMOS's are matched, and the resistance of resistor R2 126a equals N times the resistance of resistor R1 106a, i.e., $$R2 = N*R1. \qquad (2)$$

Thus, when the voltage V2 is less than (N+1)V1, then the output voltage VO is high (i.e., at the voltage V1 or another predefined voltage). When the voltage V2 is greater than (N+1)V1, then the output voltage VO can be low (i.e., ground or another predefined voltage).

Figure 2:
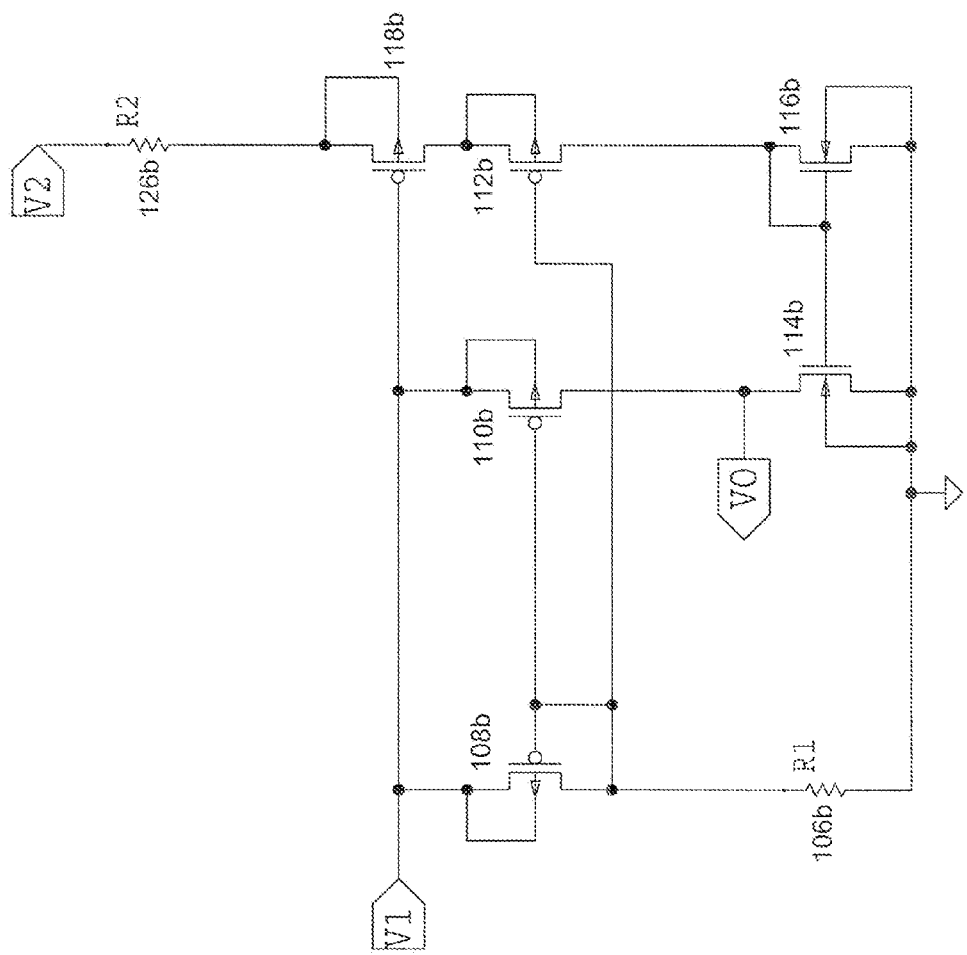
FIG. 2 illustrates a circuit diagram of a 2× comparator of the present invention.

FIG. 2 illustrates a circuit diagram of a 2× comparator of the present invention. Similar in concept to the circuit diagram shown in FIG. 1, here in FIG. 2, the output voltage VO changes state (i.e., from high to low or low to high) when the voltage V2 is equal to two times the voltage V1. Notice the PMOS string of matched devices comprises a single PMOS device 118b. Thus, N is equal to one and, according to Equation (1), the trip point is when the voltage V2 is equal to two times the voltage V1.

In terms of physical connections, the PMOS 118b has its body-connected source connected to a resistor R2 126b. The other end of the resistor R2 126b is connected to the voltage V2. The output voltage VO is at the connection between two current mirrors, where NMOS devices 114b and 116b form a matched current mirror and PMOS devices 108b and 110b from another matched current mirror. Also, PMOS devices 108b, 110b, 112b, and 118b, are also matched to each other. If the resistor R2 126b is equal to the resistor R1 106b, then the condition for a transition occurs when the current in the PMOS 110b equals the current in the NMOS 114b. Based upon perfect matching, a simple analysis gives the mathematical result of the voltage V2 equaling twice the voltage V1 at the transition condition.

Figure 3:
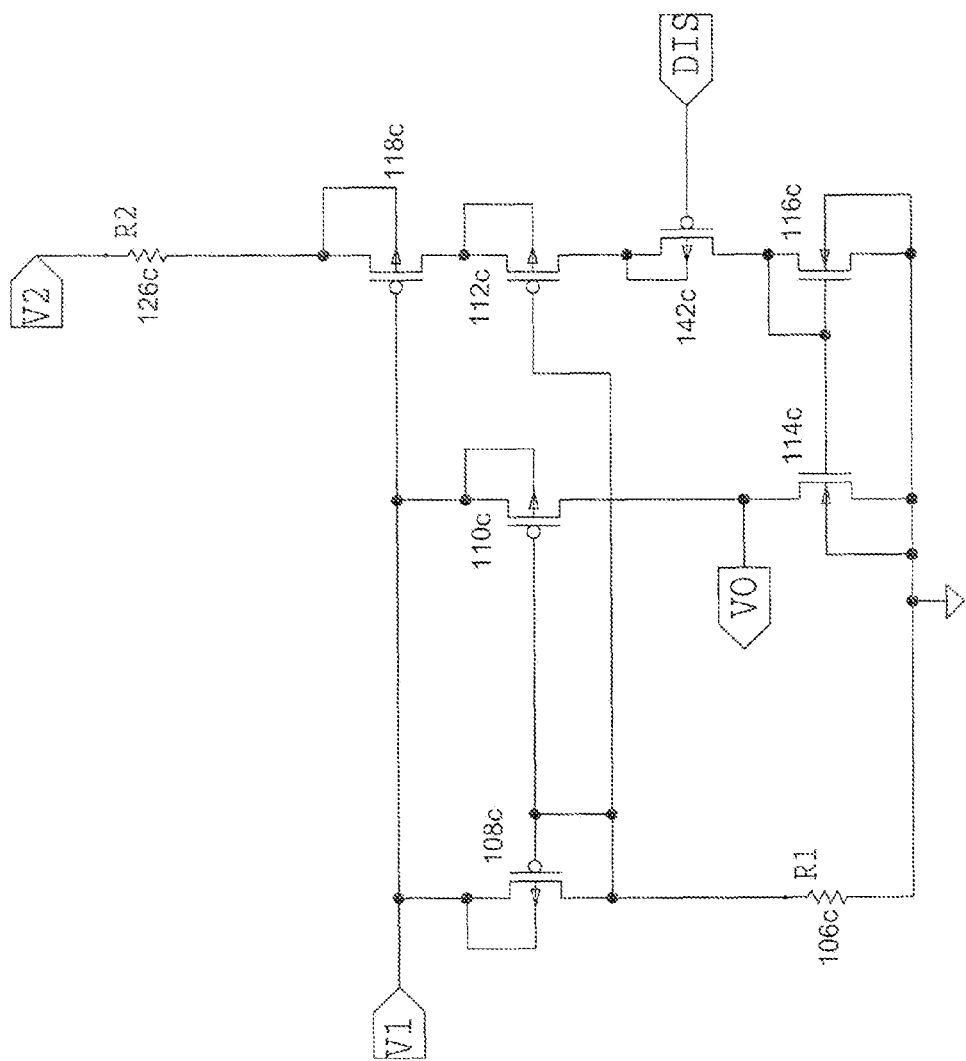
FIG. 3 illustrates a circuit diagram of a 2× comparator with a disable function of the present invention.

FIG. 3 illustrates a circuit diagram of a 2× comparator with a disable function of the present invention. Generally, the comparator is similar to the 2× comparator illustrated in FIG. 2. However, a disable function is implemented by connecting a PMOS 142c between an NMOS 116c and a PMOS 112c. The body-connected source of the PMOS 142c is connected to the drain of the PMOS 112c, and the drain of the PMOS 142c is connected to the gate and drain of the NMOS 116c. The NMOS 116c and an NMOS 114c form a current mirror, and the PMOS 112c, a PMOS 110c and a PMOS 108c are matched. The remaining connections are similar to that shown in FIG. 2.

A disable signal DIS is connected to the gate of the PMOS 142c. When the disable signal DIS is equal to 0 volt (i.e., low), then the circuit can be enabled and compares the voltages V1 and V2. When the disable signal DIS is equal to the voltage V1 (i.e., high), the output is independent of the voltages V1 and V2 and the output voltage VO will equal to the voltage V1. Thus, the comparator is disabled during a high state of the disable signal DIS. One practiced in the art of designing integrated circuits should understand there are alternative embodiments for adding a disable feature, which can also be incorporated in a comparator of the present invention.

Figure 4:
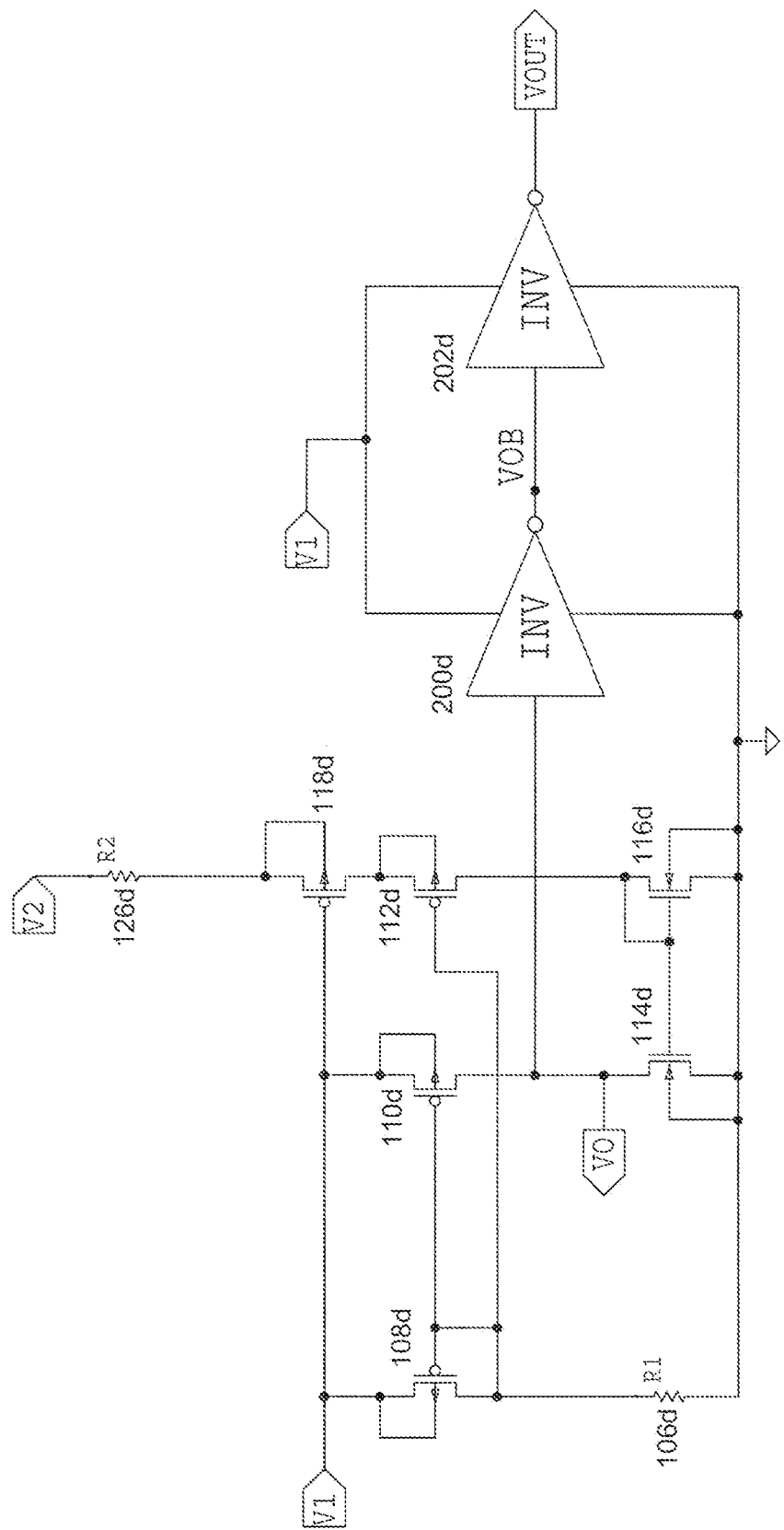
FIG. 4 illustrates a circuit diagram of a 2× comparator with a buffering mechanism of the present invention.

FIG. 4 illustrates a circuit diagram of a 2× comparator with a buffering mechanism of the present invention. A buffering mechanism can be implemented by connecting two inverters 200d and 202d in series to a voltage output VO; the resulting buffered output can be a voltage VOUT. The voltage V1 and ground can also be inputted to the inverters 200d and 202d. The additional inverters 200d and 202d increase the comparator's gain via a technique referred to as buffering, which is understood by one practiced in the art of designing circuits. The remaining connections are similar to that shown in FIG. 2.

Figure 5:
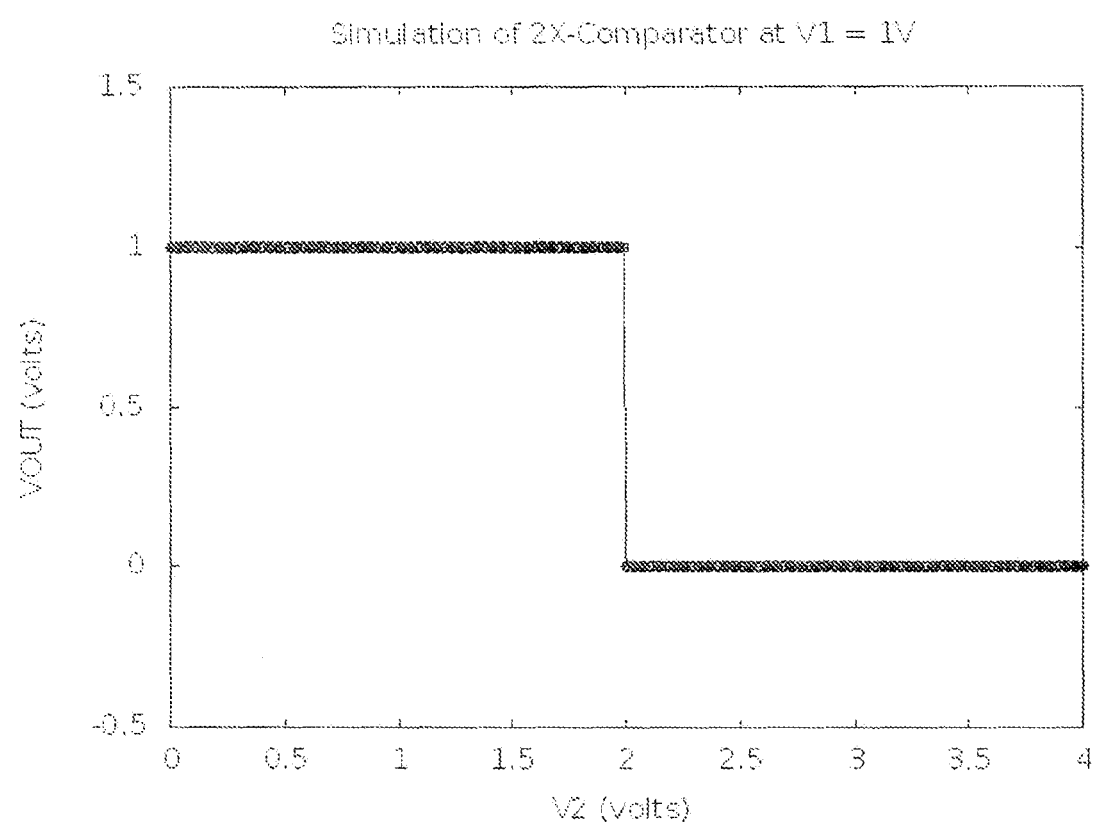
FIG. 5 illustrates a graphical simulation of DC-characteristics of a 2× comparator of the present invention.

FIG. 5 illustrates a graphical simulation of DC-characteristics of a 2× comparator of the present invention. The circuit diagram illustrated in FIG. 4 can be used for the purposes of running a simulation, where the following values are assigned for the circuit: the PMOS devices 108d, 110d, 112d, and 118d have a channel width equal to 8 μm (i.e., eight microns) and a channel length equal to 4 μm; the NMOS devices 114d and 116d have a channel width equal to 6 μm and a channel length equal to 3 μm; and the resistors R2 126d and R1 106d are both equal and have a value of 1 mega-ohms. The simulation is the result of a DC-sweep using common 0.35 μm device models. The plot illustrates the voltage VOUT versus the voltage V2 when the voltage V1 is equal to 1 volt. The transition point of the graph is when the voltage V2 equals 2 volts, which agrees with theory for the 2× comparator of the present invention.

Figure 6:
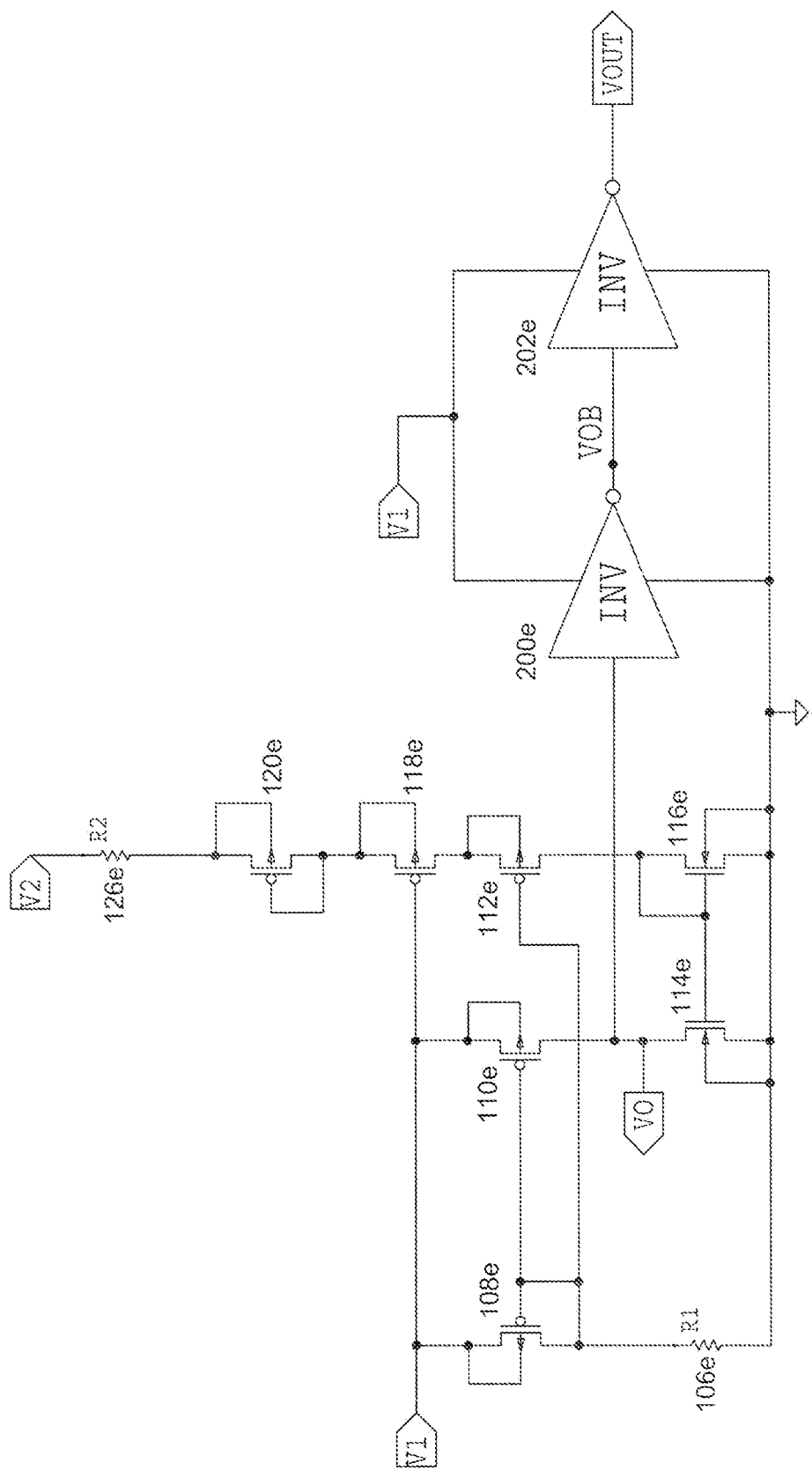
FIG. 6 illustrates a circuit diagram of a 3× comparator with a buffering mechanism of the present invention.

FIG. 6 illustrates a circuit diagram of a 3× comparator with a buffering mechanism of the present invention. A 3× comparator is similar in concept to a 2× comparator with a buffering mechanism. However, the 3× comparator's output voltage VO changes state when a voltage V2 equals three times a voltage V1. Notice, a PMOS string of matched devices comprises two PMOS devices 118e and 120e. The body-connected source of the PMOS 120e transistor is connected to a resistor R2 126e. The other end of the resistor R2 126e is connected to the voltage V2. The output voltage VO is at the connection between two current mirrors, where NMOS devices 114e and 116e form a matched current mirror and PMOS devices 108e and 110e form another matched current mirror. Also, the PMOS devices 108e, 110e, 112e, 118e, and 120e are matched. A buffering mechanism can be implemented by connecting two inverters 200e and 202e in series to a voltage output VO, where the voltage V1 and ground are inputted to the inverters 200e and 202e. The resulting buffered output can be a voltage VOUT.

In this case, N is equal to two since there are two PMOS devices 120e and 118e in the string. Thus, according to Equation (1), the 3× comparator has a trip point when the voltage V2 equals three times the voltage V1. If the resistance of the resistor R2 126e is equal to twice the resistance of the resistor R1 106e, then the condition for a transition occurs when the current through the PMOS 110e equals the current through the NMOS 114e. A simple analysis based upon perfect matching gives the result that the voltage V2 equals three times the voltage V1 at the transition condition. The comparator circuit can also use inverters 200e and 202e for buffering the output voltage VO to generate the voltage VOUT.

Figure 7:
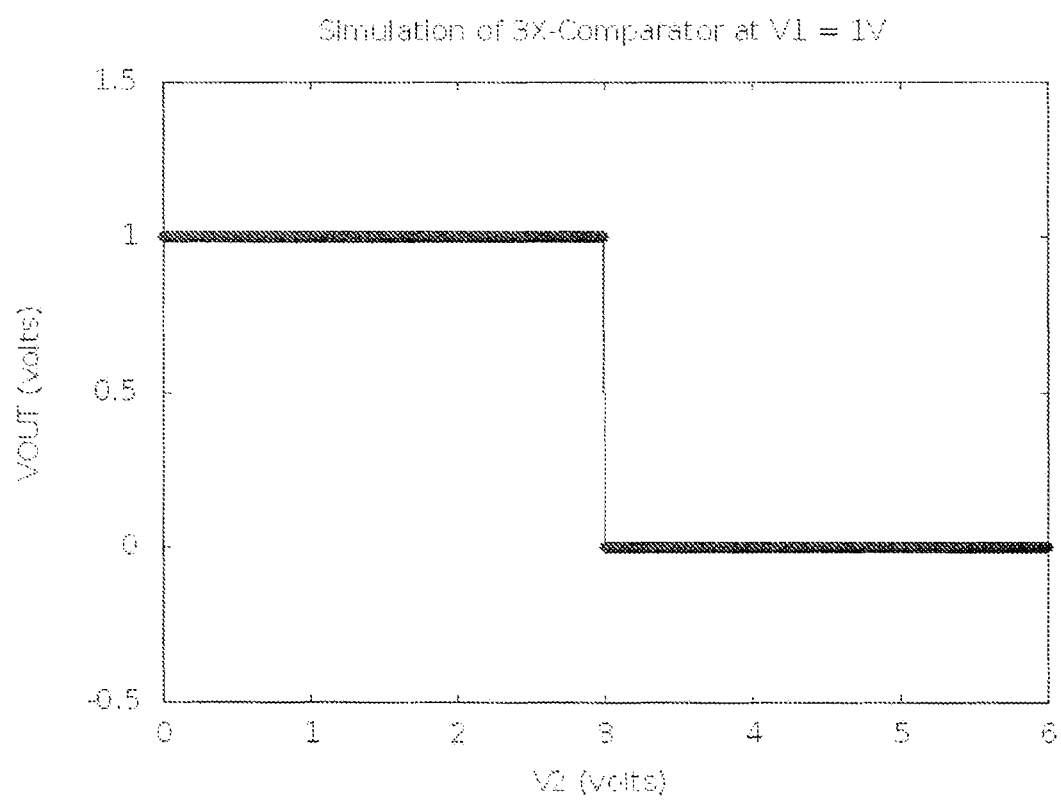
FIG. 7 illustrates a graphical simulation of DC-characteristics of a 3× comparator of the present invention.

FIG. 7 illustrates a graphical simulation of DC-characteristics of a 3× comparator of the present invention. The circuit diagram illustrated in FIG. 6 can be used for the purposes of running a simulation, where the following values are given: the PMOS devices 108e, 110e, 112e, 118e, and 120e have a channel width equal to 8 μm (microns) and a channel length equal to 4 μm; the NMOS devices 114e and 116e all have a channel width equal to 6 μm and a channel length equal to 3 μm; and the resistor R2 126e is equal to 2 mega-ohms and the resistor R1 106e is equal to 1 mega-ohms to satisfy a condition that the resistance of the resistor R2 126e is two times the resistance of the resistor R1 106e. The simulation is the result of a DC-sweep using common 0.35 μm device models. The plot illustrates the voltage VOUT versus the voltage V2 when the voltage V1 is equal to 1 volt. Thus, the transition point is when the voltage V2 equals 3 volts, which agrees with theory for a 3× comparator of the present invention.

Figure 8:
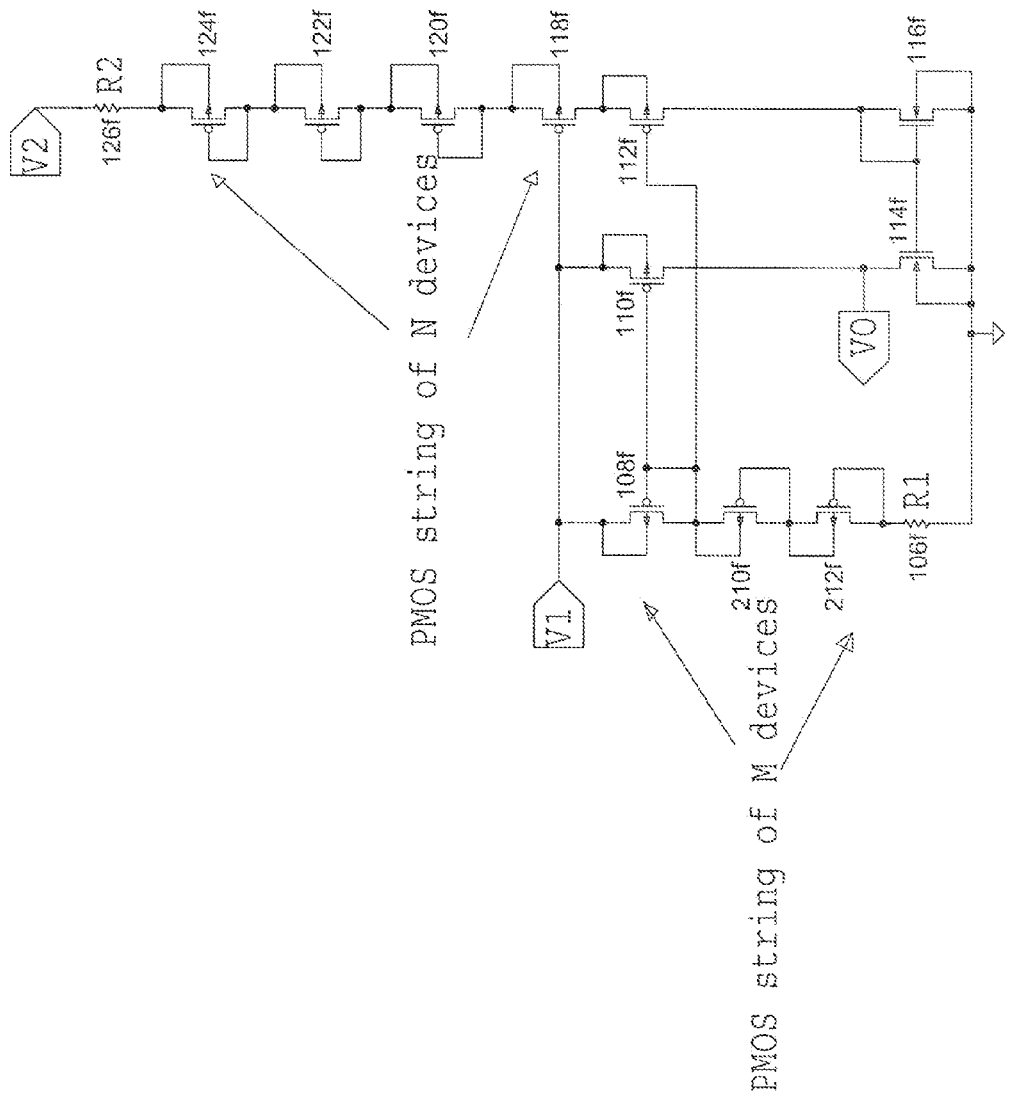
FIG. 8 illustrates a circuit diagram of a comparator of the present invention for comparing a scaled multiple of a voltage V2 to another voltage V1.

FIG. 8 illustrates a circuit diagram of a comparator of the present invention for comparing a scaled multiple of a voltage V2 to another voltage V1. The comparator implements a technique for comparing non-integer scale factors. In other words, the trip point for a voltage V2 can be equal to a non-integer value multiplied by a voltage V1. The body-connected source of an NMOS 116$f$ is connected to ground while its gate and drain are both connected to the drain of a PMOS 112$f$. PMOS devices 108$f$ and 110$f$ form a current mirror; and NMOS devices 114$f$ and 116$f$ form another current mirror. The drain of the PMOS 110$f$ and the drain of the NMOS 114$f$ are connected and have an output voltage VO. The body-connected source of the PMOS 112$f$ is connected to the drain of a PMOS 118$f$, and the PMOS 112$f$ is matched to the PMOS 110$f$ and the PMOS 108$f$. The PMOS devices 118$f$, 120$f$, 122$f$, and 124$f$ form a string of matched devices connected in series. In general, any number N of PMOS devices may be connected in series as needed in the string.

Each PMOS from the set of PMOS devices 118$f$, 120$f$, 122$f$, and 124$f$, has its body connected to its respective source. The gate of the PMOS 118$f$ is connected to the voltage V1 and its body-connected source is connected to the drain and gate of the PMOS 120$f$. The remaining PMOS devices 120$f$, 122$f$, and 124$f$ are connected in series. The gate and drain of PMOS 122$f$ is connected to the body-connected source of 120$f$ and so on along the series until the final PMOS 124$f$. The body-connected source of PMOS 124$f$ is connected to an end of a resistor R2 126$f$. The other end of the resistor R2 126$f$ is connected to the voltage V2.

The PMOS devices 108$f$, 210$f$, and 212$f$ form another string of matched devices connected in series. In general, any number, M, of PMOS devices may be connected in series in this string as needed. Each PMOS from this set of PMOS devices 108$f$, 210$f$, and 212$f$ has its body connected to its respective source and its gate connected to its respective drain. The final PMOS in the chain, PMOS 212$f$, has its drain and gate connected to an end of the resistor R1 106$f$. The other end of the resistor R1 106 is connected to ground. Thus, performing a circuit analysis, the comparator has a trip point when $$V2 = (R2/R1+1)V1, \quad (3)$$

where R2/R1 can be any fraction.

Here, there are four PMOS devices 118$f$-124$f$, and there are three PMOS devices 108$f$, 210$f$, and 212$f$. In general, assuming there are N PMOS devices (instead of four as drawn) and M PMOS devices (instead of three as drawn) and the voltage V2 equals R2/R1+1 times the voltage V1, the output voltage VO can transition from one state to another state if the following conditions are met: the product of M times the resistance of resistor R2 126$f$ is equal to the product of N times the resistance of resistor R1 106$f$, i.e., $$M*R2 = N*R1; \quad (4)$$

all drawn PMOS devices are matched and are of equal size; all drawn NMOS devices are matched and of equal size. Thus, Equation (3) can be rewritten as $$V2 = (N/M+1)V1. \quad (5)$$

A goal of the design is to cause the gate-source potentials of the PMOS devices 118$f$, 108$f$, 210$f$ and 212$f$ to match at the trip-point condition.

In this manner and with the appropriate scaling of the resistances of the resistors R2 126$f$ and R1 106$f$, the trip point (i.e., condition for a transition) of the output voltage VO can be independent of the VGS and process parameters. This general technique for building a comparator is very convenient for positive charge-pump systems as previously discussed. The comparator trip point is determined by the condition that the drain current of the NMOS 614$f$ is equal to the drain current of the PMOS 110$f$. In theory, the trip point can be determined by Equation (5), assuming all the PMOS's are matched and identical, all the NMOS devices are matched and identical, and the resistance of the resistor R2 126$f$ times M equals the resistance of the resistor R1 times N.

Figure 9:
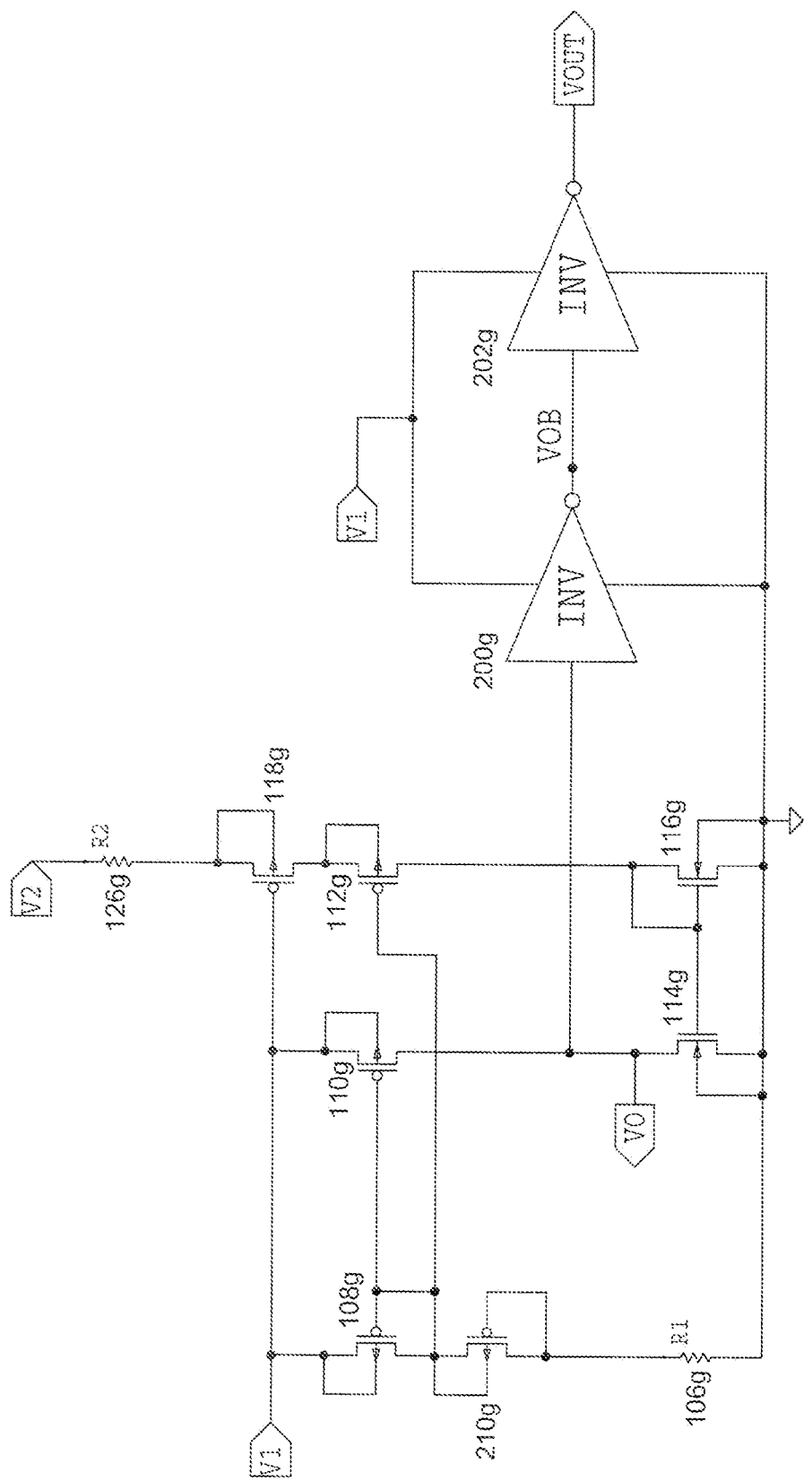
FIG. 9 illustrates a circuit diagram of a 1.5× comparator with a buffering mechanism of the present invention.

FIG. 9 illustrates a circuit diagram of a 1.5× comparator with a buffering mechanism of the present invention. An output voltage VO changes state when a voltage V2 is 1.5 times a voltage V1. A first PMOS string of matched devices comprises two PMOS devices 108$g$ and 210$g$; thus, M is equal to two. A second PMOS string comprises a PMOS 118$g$; thus, N is equal to one. The drain of the PMOS 118$g$ is connected to an end of a resistor R2 126$g$, and the other end of the resistor R2 126$g$ is connected to the voltage V2. The PMOS devices 108$g$ and 110$g$ form a current mirror. NMOS devices 114$g$ and 116$g$ form another matched current mirror. The two current mirrors are connected at the drain of the PMOS 110$g$ and the drain of the NMOS 114$g$, where the connection has an output voltage VO. Also, the PMOS devices 108$g$, 110$g$, 112$g$, 118$g$, and 210$g$ are matched. A buffering mechanism can be implemented by connecting two inverters 200$g$ and 202$g$ in series to the output voltage VO, where the voltage V1 and ground are inputted to the inverters 200$e$ and 202$e$. The resulting buffered output can be a voltage VOUT.

Thus according to Equation (5), the 1.5× comparator has a trip point when the voltage V2 equals 1.5 times the voltage V1. In this case N is equal to one since there is one PMOS device in the second string and M is equal to two since there are two PMOS devices in the first string. If the resistance of the resistor R1 106$g$ is equal to twice the value of the resistance of the resistor R2 126$g$, then the condition for a transition occurs when the currents of the two current mirrors are equal. A simple analysis based upon perfect matching gives the result that the voltage V2 equals 1.5 times the voltage V1 at the transition condition.

Figure 10:
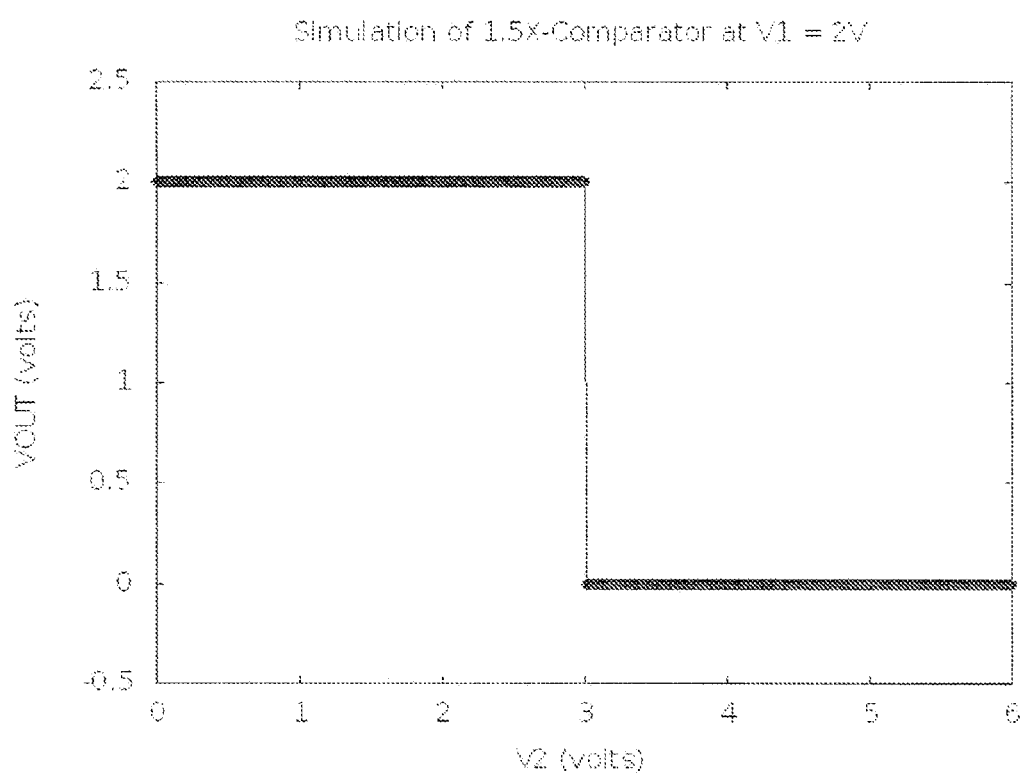
FIG. 10 illustrates a graphical simulation of DC-characteristics of a 1.5× comparator of the present invention.

FIG. 10 illustrates a graphical simulation of DC-characteristics of a 1.5× comparator of the present invention. The circuit diagram illustrated in FIG. 9 can be used for the purposes of running a simulation, where the following values are given: the PMOS devices 108$g$, 110$g$, 112$g$, 118$g$, and 210$g$ can each have a channel width equal to 8 μm (microns) and a channel length equal to 4 μm. The NMOS devices 114$g$ and 116$g$ each have a channel width equal to 6 μm and a channel length equal to 3 μm. The resistance of the resistor R1 106$g$ is equal to 2 mega-ohms and the resistance of the resistor R2 126$g$ is equal to 1 mega-ohms. The simulation is the result of a DC-sweep using common 0.35 μm device models. The plot illustrates the voltage VOUT versus the voltage V2 when the voltage V1 is equal to 2 volts. The transition point is when the voltage V2 equals 3 volts, which agrees with theory for a 1.5× comparator of the present invention.

Figure 11:
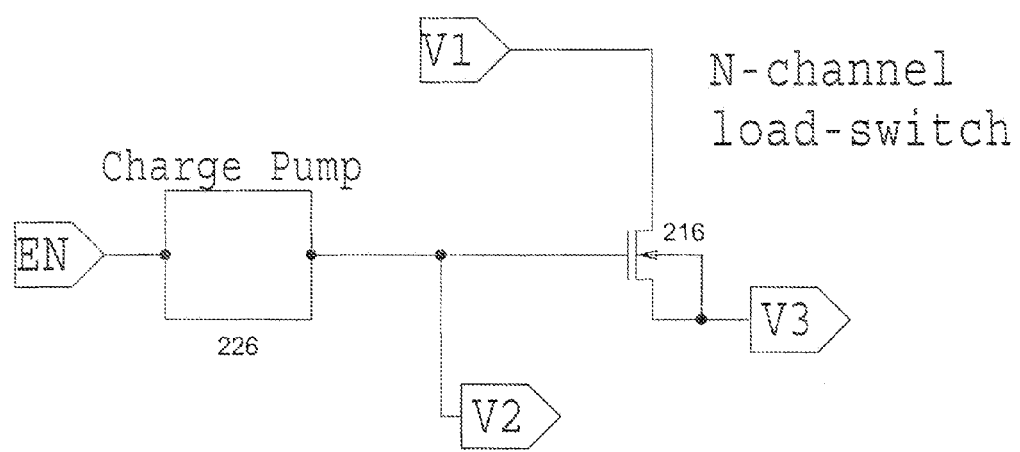
FIG. 11 illustrates a schematic of a simplified N-channel load switch with a positive-charge-pump system.

FIG. 11 illustrates a schematic of a simplified N-channel load switch with a positive-charge-pump system. A charge-pump block 226 has an enable input signal En and outputs a charge-pump output voltage V2. An N-channel load switch 216 can have three voltages: a drain voltage; a gate voltage; and a source voltage at its body-connected source. It is noted that in this system the N-channel body can also be connected to the lowest potential, which is typically ground.

Comparators of the present invention are well suited for controlling this type of system with the following arrangement. A comparator of the present invention can compare the three voltages of the load switch, where the voltage V2 of the comparator is the gate voltage, the voltage V1 of the comparator is the drain voltage, and the voltage V3 of the comparator is the body-connected source voltage. It is noted that the body can also be connected to the lowest system voltage potential, such as ground. Now suppose to protect the gate of the N-channel load switch 216, the gate voltage V2 is limited to not exceed 2.5 (or any other value) times the value of the drain voltage V1. By using an N/M comparator of the present invention, the output of a 2.5×-comparator can provide the enable signal to the charge pump 226. When the voltage V2 at the gate exceeds 2.5 times the value of the voltage V1, then the output of the 2.5× comparator can, by design, disable the charge pump 226. While this protects the gate with respect to the drain of the N-channel load switch 216, another degree-of-freedom becomes available by including the voltage V3.

Figure 12:
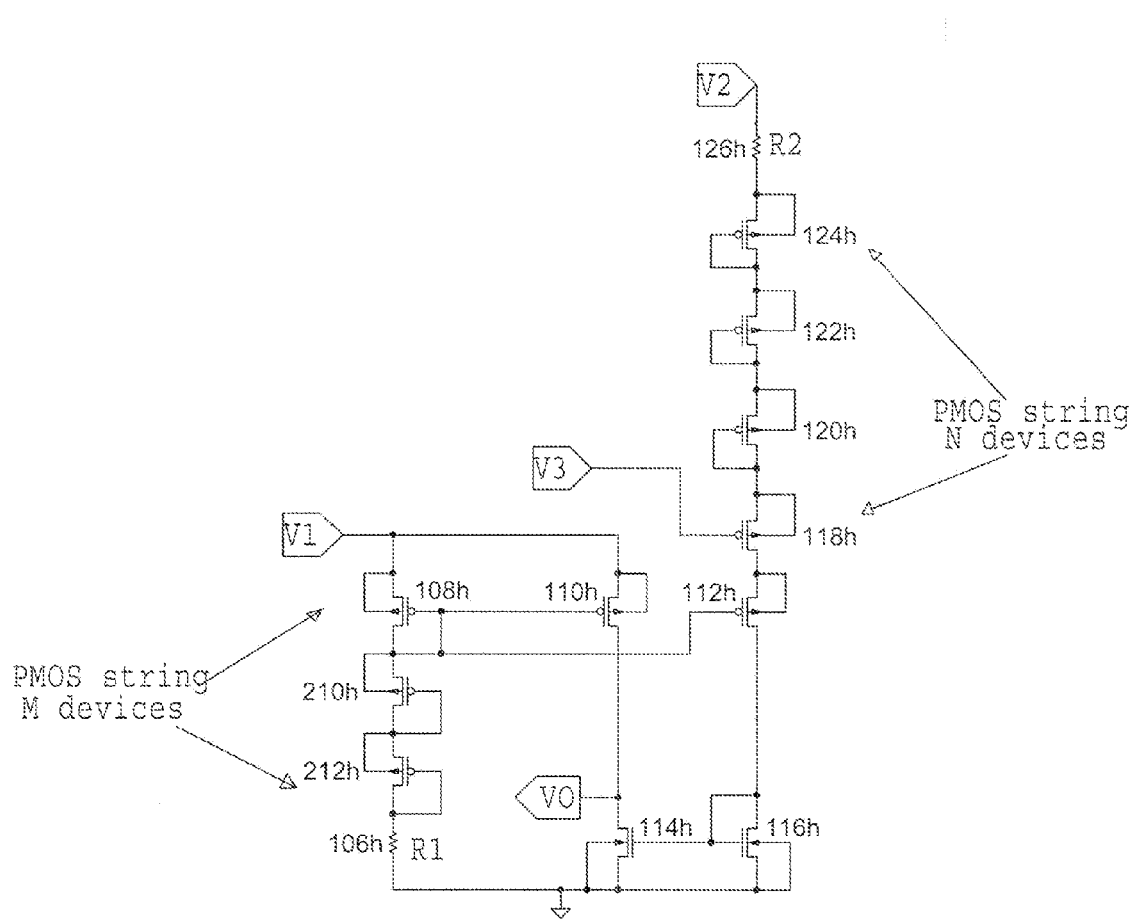
FIG. 12 illustrates a circuit diagram of a comparator of the present invention for comparing a scaled multiple M/N of a voltage V2 to another voltage V1.

FIG. 12 illustrates a circuit diagram of a comparator of the present invention for comparing a scaled multiple M/N of a voltage V2 to another voltage V1. Unlike the schematic in FIG. 1 and FIG. 8, this schematic in FIG. 12 illustrates a general technique of the present invention for realizing a non-integer scale factor and also comparing the voltages V2 and V1 relative to a third voltage V3. The connections are similar to the connection in the circuit diagram illustrated in FIG. 8. However, the gate of a PMOS 118h is connected in series to the voltage V3. Furthermore, there is a string of M devices connected to the voltage V1. Thus, the condition for a trip point also becomes dependent upon the voltage V3.

Given the matching conditions, a trip point occurs when $$V2=(R2/R1)V1+V3. \qquad (6)$$

In addition to the VGS matching conditions as outlined in the description of FIG. 8, there is also an operating point condition placed upon the PMOS 118h. The condition of R2/R1 times the voltage V1 plus the voltage V3 equals the voltage V2 holds when the PMOS 118h operates in the active or MOS saturation region. Those familiar with MOS operation understand the saturation versus linear region operation of MOS transistors. If the PMOS device 118h enters the linear region, then the condition for the trip point is modified. An advantage to connecting the voltage V3 to the gate of the PMOS 118h is that the gate of the respective N-channel load switch (shown in FIG. 11) can always be protected with reference to the source potential.

Figure 13:
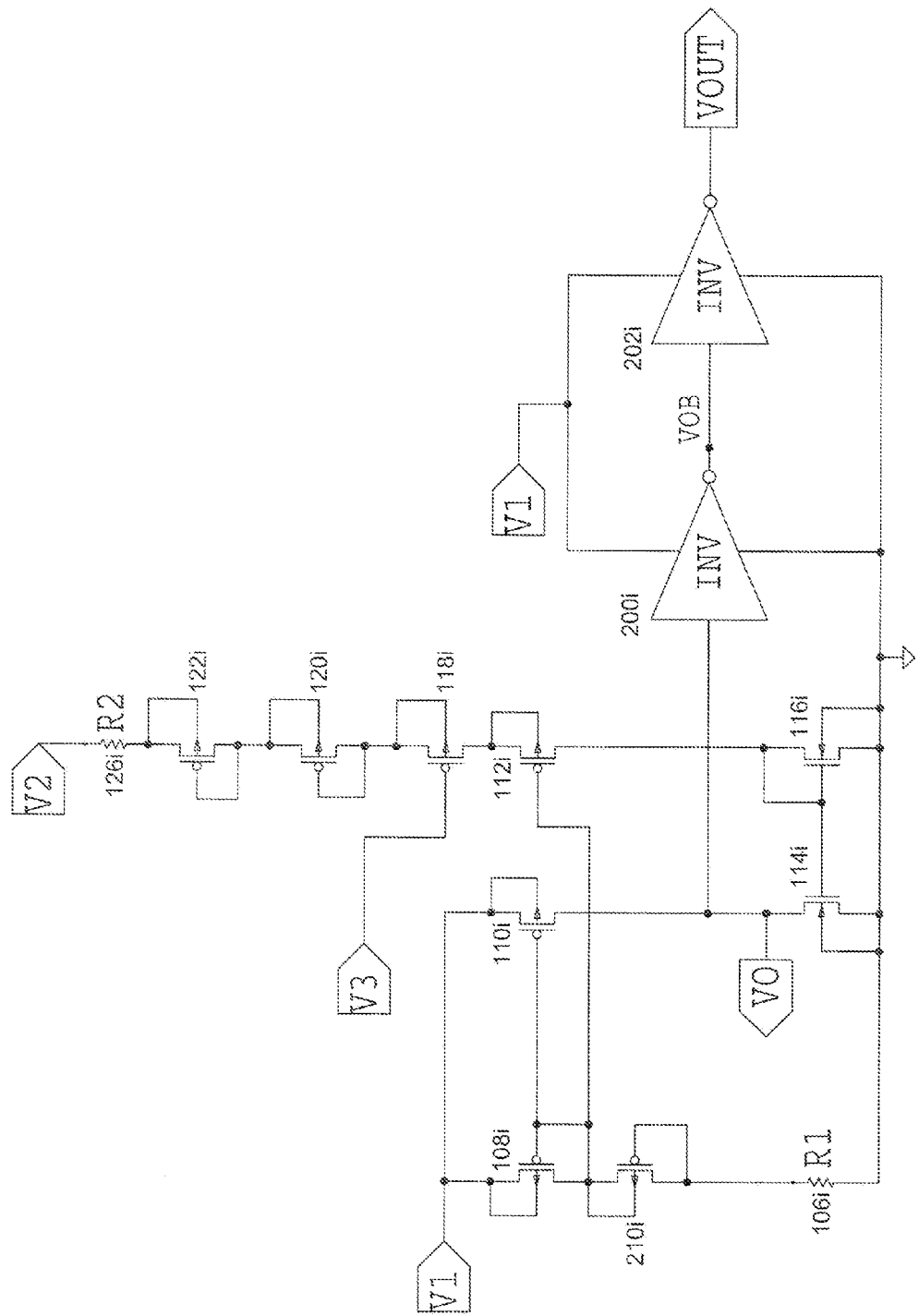
FIG. 13 illustrates a circuit diagram of a 3/2 comparator of the present invention.

FIG. 13 illustrates a circuit diagram of an N/M comparator of the present invention. Similar in concept to the circuit diagram illustrated in FIG. 12, this embodiment includes buffering. Furthermore, an output voltage, VO, changes state when a voltage V2 is 1.5 times a voltage V1 plus a voltage V3. Notice one PMOS string of matched devices comprises PMOS devices 118i, 120i, and 122i, i.e., N=3. The drain of the PMOS 122i is connected to a resistor R2 126i. The other end of the resistor R2 126i is connected to the voltage V2. Notice the other PMOS string of matched devices now comprises two PMOS devices 108i and 210i, i.e., M=2.

Similarly to earlier embodiments of the present invention, the NMOS devices 114i and 116i form a matched current mirror; the PMOS devices 108i and 110i form another matched current mirror. The drain of the NMOS 114i is connected to the drain of the PMOS 110i, where the connection has an output voltage VO. Also the PMOS devices 108i, 110i, 112i, 118i, 120i, 122i, and 210i are matched. Buffering can be implemented by connecting two inverters 200i and 202i in series to the output voltage VO. Note that the voltage V3 is connected to the gate of the PMOS 118i.

The N/M comparator has a trip point determined by the voltage V2 equals 1.5 times the voltage V1 plus the voltage V3. In this case N is equal to three and M is equal to two. Thus, if the resistance of the resistor R1 106i times 3 is equal to the resistance of the resistor R2 126i times 2, the condition for a transition occurs when the currents in the two current mirrors are equal. A circuit analysis based upon perfect matching gives the result that the voltage V2 equals 1.5 times the voltage V1 plus the voltage V3 at the transition condition. This circuit can also use inverters 200i and 202i as previously discussed for buffering.

Figure 14:
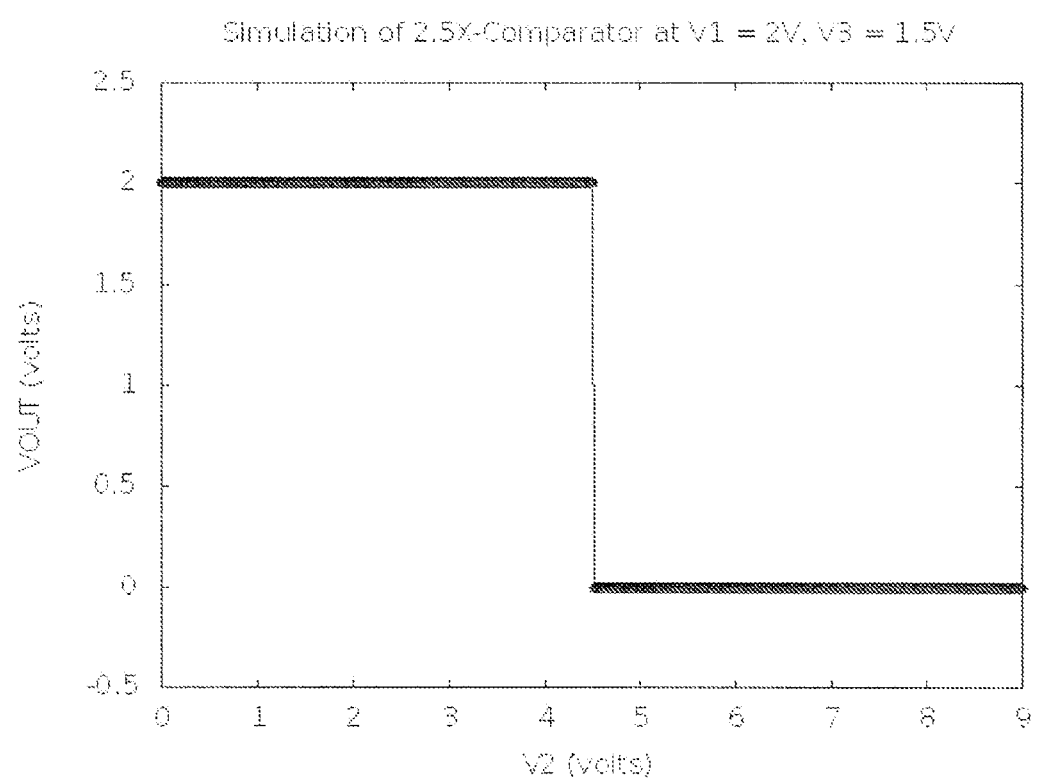
FIG. 14 illustrates a graphical simulation of DC-characteristics of a 3/2 comparator of the present invention.

FIG. 14 illustrates a graphical simulation of DC-characteristics of an N/M comparator of the present invention. The circuit diagram illustrated in FIG. 13 can be used for the purposes of the simulation, where the following values are given: the PMOS devices have a channel width equal to 8 µm (microns) and a channel length equal to 4 µm; the NMOS devices have a channel width equal to 6 µm and a channel length equal to 3 µm; the resistor R1 106i is equal to 2 mega-ohms and the resistor R2 126i is equal to 3 mega-ohms. The simulation is the result of a DC-sweep using common 0.35 µm device models. The plot illustrates the voltage VOUT versus the voltage V2 when the voltage V1 is equal to 2 volts and the voltage V3 is equal to 1.5 volts. The transition point is when the voltage V2 equals 4.5 volts, which agrees with theory.

Figure 15:
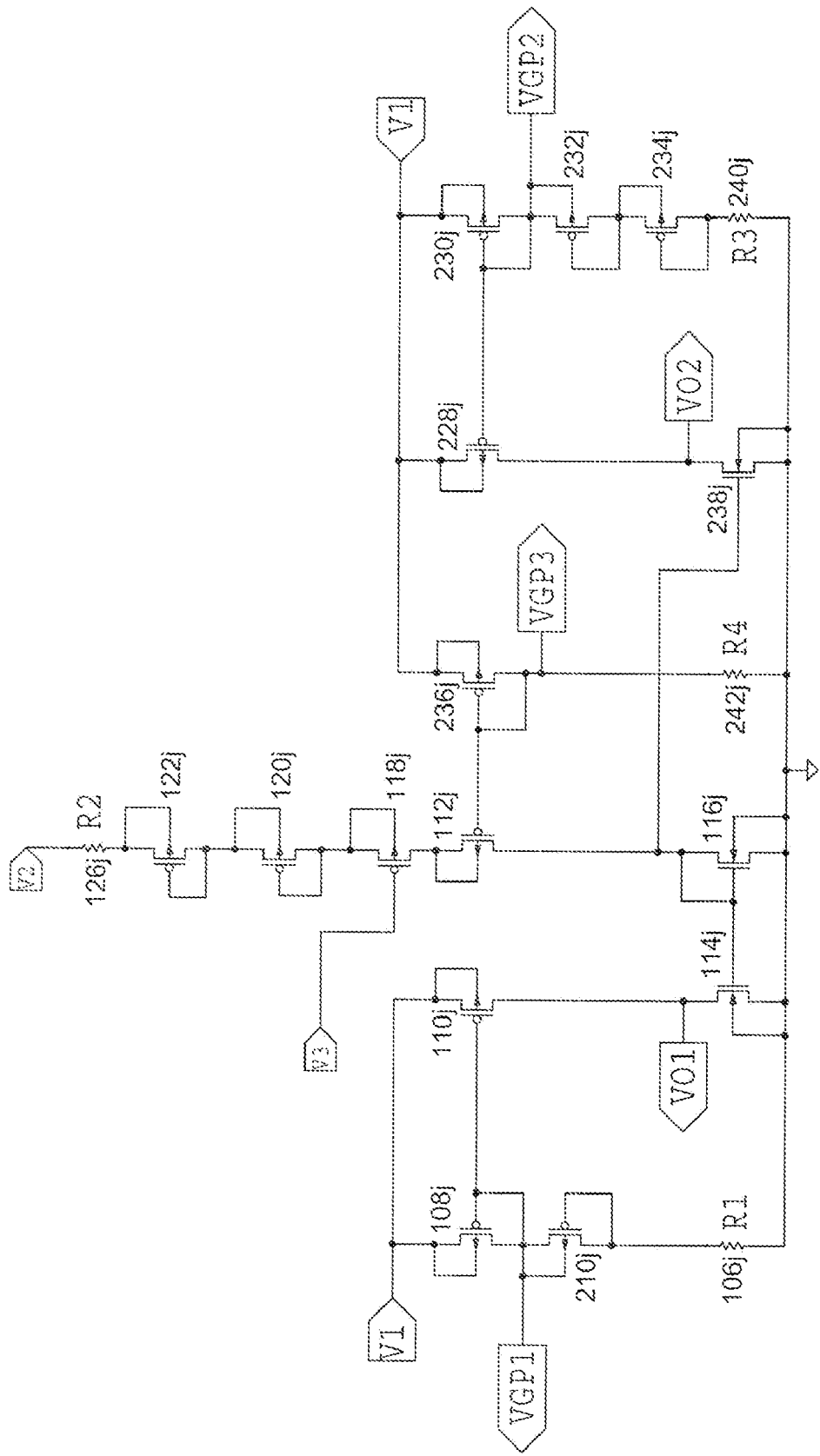
FIG. 15 illustrates a circuit diagram for combining more than one comparator of the present invention.

FIG. 15 illustrates a circuit diagram for a combination comparator of the present invention. The circuit diagram combines a 2.5× comparator and a 2× comparator. It is understood by one skilled in the art that based on the present invention, any number of comparators can be combined as necessary. Note there is a common string of matched devices comprising PMOS devices 118j, 120j, and 122j, which is common to both the 2.5× comparator and the 2× comparator. The body-connected source of the PMOS 122j is connected to a resistor R2 126j. The other end of the resistor R2 126j is connected to a voltage V2. Notice again the connection of a voltage V3 to the gate of the PMOS 118j. Furthermore, the PMOS devices 118j, 120j, and 122j each have its respective body connected to its respective source. The body-connected source of PMOS 120j is connected to the gate and drain of the PMOS 122j, and the body-connected source of PMOS 118j is connected to the gate and drain of PMOS 120j.

Also, there are two additional, independent strings of PMOS devices. One string comprises the matched PMOS devices 108j and 210j. The gate and drain of the PMOS 210j is connected to an end of the resistor R1 106j. The other end of the resistor R1 106j is connected to ground. The body-connected source of the PMOS 112j is connected to the drain of the PMOS 118j, and the PMOS 112j is matched to the PMOS devices 110j and 108j. The body-connected source of the PMOS 108j is connected to the voltage V1. The gate-connected drain of the PMOS 108j is connected to the body-connected source of the PMOS 210j. The body-connected source of NMOS 116j is connected to ground, while its gate and drain are both connected to the drain of the PMOS 112j. The NMOS devices 116j and 114j form a current mirror, and the drain of the NMOS 114j is connected to a voltage VO1. The PMOS devices 108j and 110j form a current mirror, and the drain of the PMOS 110j also is connected to the voltage VO1. In this special case the PMOS 112j is biased by a PMOS 236j. The PMOS 236j may either be matched or a scaled multiple of the PMOS 112j.

In general, all PMOS devices are matched and all NMOS devices are matched. The gate of the PMOS 112j is connected to the gate connected drain of the PMOS 236j. The source of the PMOS 236j is connected to the voltage V1. The gate and drain of the PMOS 236j is connected to one end of a resistor R4 242j. The other end of the resistor R4 242j is connected directly to ground.

The second string of PMOS devices is comprises PMOS devices 230j, 232j, and 234j. The gate-connected drain of the PMOS 234j is connected to an end of a resistor R3 240j. The other end of the resistor R3 240j is connected to ground. The body-connected source of the PMOS 230j is connected to the voltage V1, while its gate-connected drain is connected to the body connected source of the PMOS 232j. The gate-connected drain of PMOS 232j is connected to the body-connected source of the PMOS 234j. The PMOS devices 228j and 230j form a matched current mirror as drawn. The body-connected sources of the PMOS 228j and the PMOS 230j both connect to the voltage V1. The drain of the PMOS 228j is connected to a voltage VO2. The gate of the PMOS 228j is connected to the gate of the PMOS 230j. The NMOS devices 238j and 116j are also matched. The gate of the NMOS 238j is connected to the gate of the NMOS 116j. The drain of the NMOS 238j also is connected to the voltage VO2.

Figure 16:
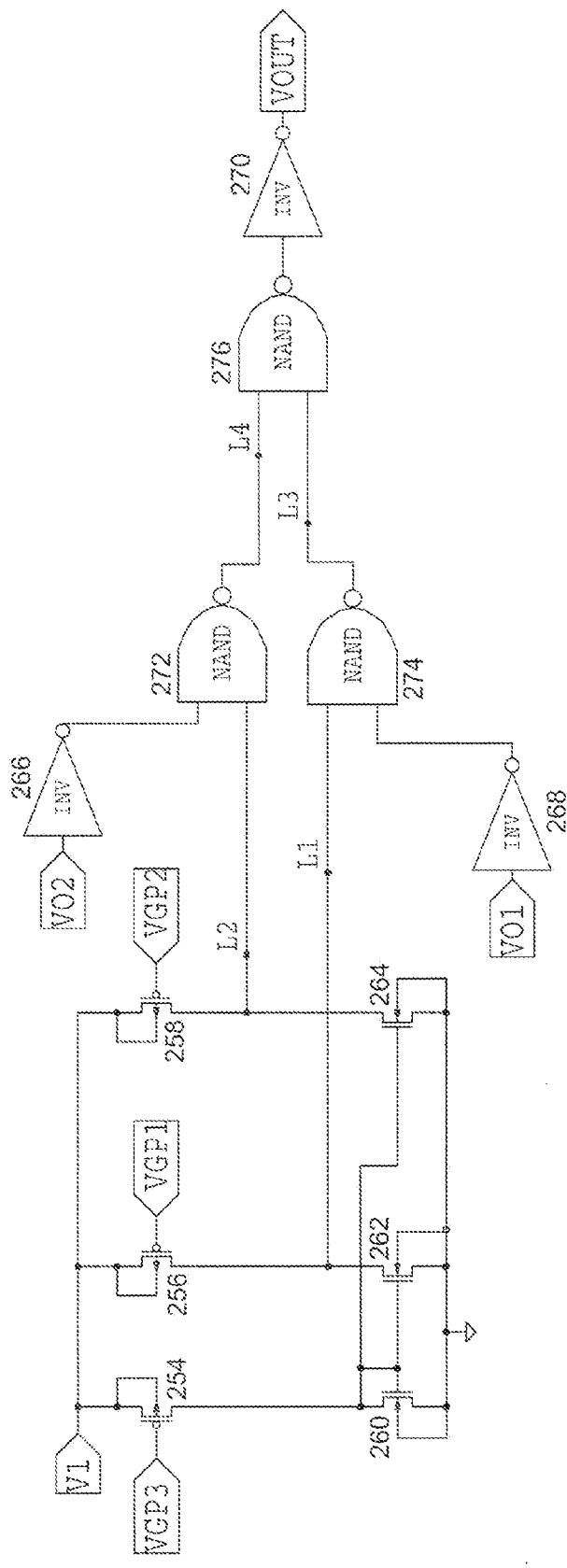
FIG. 16 illustrates a circuit diagram for extending a comparator's low-voltage range.

The voltages VGP1, VGP2, and VGP3 can be derived from the gates of the PMOS devices 108j, 230j, and 236j, respectively and can be used in the circuit diagram illustrated in FIG. 16 to extend a comparator's low-voltage range of the voltages VO1 and VO2 as a function of the voltage V1.

In terms of operation, a combination comparator offers two logic output voltages VO1 and VO2. The devices and resistor values of the comparator can be chosen so that the voltage VO1 can transition low when the voltage V2 is equal to the voltage V1 times 1.5 (or any other non-integer value can be selected depending on the comparators combined) plus the voltage V3. Furthermore, the devices and resistor values can also be chosen such that the voltage VO2 will transition low when the voltage V2 is equal to the voltage V1 (or other integer value of the voltage V1) plus the voltage V3. A practical realization of this combination design requires a method for determining when the voltage V1 is large enough to generate sufficient bias for the branch comprising the PMOS devices 108j and 210j and for the branch comprising the PMOS devices 230j, 232j, and 234j. This may be done with comparison of the levels generated at the voltages VGP1, VGP2, and VGP3.

FIG. 16 illustrates a circuit diagram for extending a comparator's low-voltage range. Signals VGP1, VGP2, and VGP3 can be used to extend the useful range of voltages VO1 and VO2 as a function of a voltage V1. The circuit comprises three matched PMOS devices 254, 256, and 258 with their body-connected sources connected to a voltage V1 and three matched NMOS devices 260, 262, and 264, with their body-connected sources connected to ground. The voltage signal VGP3 is connected to the gate of the PMOS 254; the voltage signal VGP1 is connected to the gate of the PMOS 256; and the voltage signal VGP2 is connected to the gate of the PMOS 258. The gate-connected drain of the NMOS 260 is connected to the drain of the PMOS 254. The gate of the NMOS 260 is connected to gate of the NMOS 262 and to the gate of the NMOS 264 so that the NMOS 262 and the NMOS 264 form a mirror with the NMOS 260. The drain of the NMOS 262 is connected with the drain of the PMOS 256 to form a voltage level L1. The drain of the NMOS 264 is connected with the drain of the PMOS 258 to form a voltage level L2.

The circuit also comprises three inverters 266, 268, and 270, and three NAND gates 272, 274, and 276. These logic gates can have implicit connections to ground and to the voltage V1 such that the logic high can be equal to the voltage V1 and the logic low can be equal to ground. The voltage signal VO2 and the voltage signal VO1 are connected to the inverter 266 and to the inverter 268, respectively. The inputs to the NAND 272 are the output of the inverter 266 and the logic level L2. The inputs to the NAND 274 are the output of the inverter 268 and the logic level L1. The inputs to the NAND 276 are the output of the NAND 274, which is at a logic level L3, and the output of the NAND 272, which is at a logic level L4. The input of the inverter 270 is connected to the output of the NAND 276, and the output of the inverter 270 is connected to the voltage VOUT.

The circuit can determine when the voltage V1 is large enough to generate sufficient bias for the branches described above. By design, the bias level VGP3 can cause the PMOS 254 to deliver a current under all voltages levels V1 of interest. The circuit operates such that when the voltage V1 is large enough to set up a bias VGP1, then the current in the PMOS 256 will be large enough to force a logic level L1 to transition from low to high. Similarly, when the voltage V1 is large enough to set up bias voltage VGP2, then the current in the PMOS 258 will be large enough to force a logic level L2 to transition from low to high. The logic level L1 allows the signal VO1 to pass to the output VOUT when the logic level L1 is high. In this case, the logic high can be at the voltage level V1.

Similarly, the logic level L2 allows the signal VO2 to pass to the output VOUT when the logic level L2 is high. In this case the logic high can be at the voltage level V1. The present circuit can be used with the circuit illustrated in FIG. 15 to control the enable signal En of the charge pump 226 illustrated in FIG. 11. If the gate voltage V2, drain voltage V3, and source voltage V1 illustrated in FIG. 11 are equivalent to the voltages V2, V3, and V1 illustrated in FIG. 15, respectively, then the present circuit illustrated in FIG. 16 offers an approach for controlling the maximum gate voltage to a level dependent upon the voltage V1.

Used in this way, the present circuit can enable the enable En signal when the level of the voltage V1 is less than the value required to set up the bias for either voltage VGP1 or voltage VGP2. As the voltage V1 increases above the level required to set up the bias for the voltage VGP1, the comparator signal VO1 can begin to control or to regulate the enable signal En of the charge pump 226 illustrated in FIG. 11. This first level is defined by a 2.5× comparator level illustrated FIG. 15. As the voltage V1 increases beyond the level necessary to set up the bias for the voltage VGP2, the comparator signal VO2 begins to control the voltage VOUT by using the dominant 2× comparator level illustrated in FIG. 15.

Figure 17:
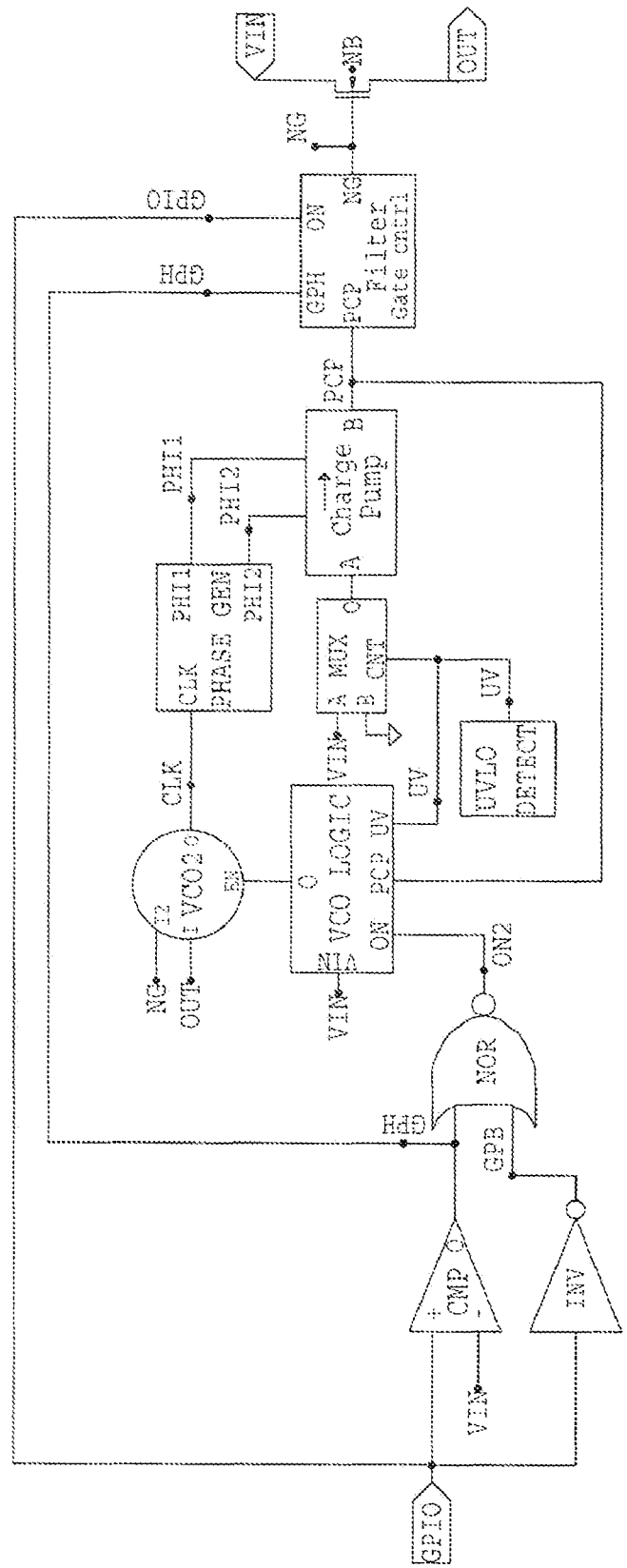
FIG. 17 illustrates a block diagram of a load switch system of a co-pending patent application, Load Switch System.

FIG. 17 illustrates a block diagram of a load switch system of a co-pending patent application, Load Switch System. The connections of specific interest here are related to a VCO logic, a multiplexer ("MUX", which is connected to a port of the charge-pump array block), and a UVLO detect block, which are all explained in detail in the Load Switch System. A comparator of the present invention can monitor the following voltage levels of the load switch system, including a voltage VIN, a voltage OUT, and a voltage PCP (the output of the charge-pump array). Typically, the comparator would have the voltage VIN connected as the voltage V1, the voltage OUT connected as the voltage V3, and the voltage PCP connected as the voltage V2.

Figure 18:
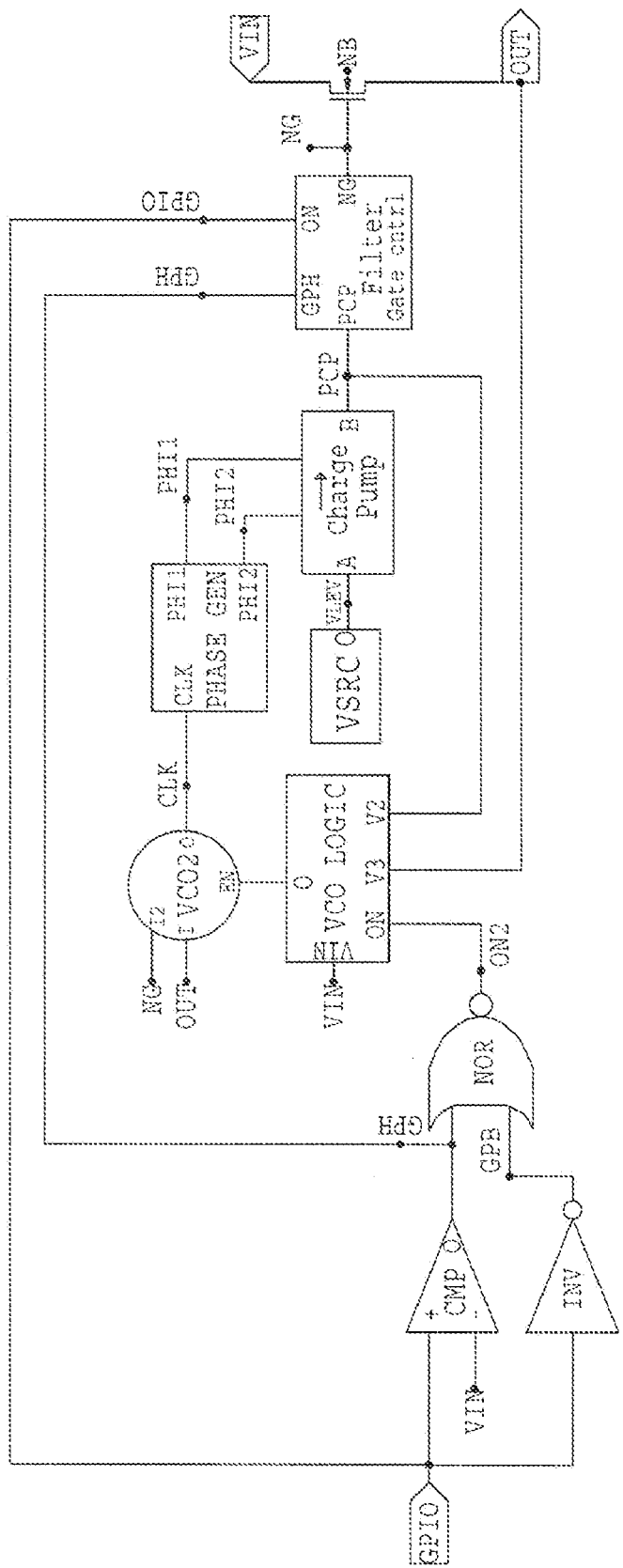
FIG. 18 illustrates a block diagram of a load switch system using a VCO logic block and a voltage generator block.

FIG. 18 illustrates another block diagram of a load switch system of a co-pending patent application, Load Switch System, using a VCO logic block and a voltage generator block. Compared to FIG. 17, there is no longer a UVLO detect block and the input A to the charge-pump array block is connected to the output of the VSRC block. This connection is labeled VLEV and can be any value between ground (logic low) and the voltage V1 (logic high). The VLEV can be the output voltage of a transmission gate or an inverter where a logic transmission gate comprises an NMOS transistor and a PMOS transistor.

The VCO logic block receives input control signals from the output of the charge-pump array PCP (i.e., a voltage V2) and from the enable signal ON2. In addition, it receives an input control signal from the voltage OUT of the N-channel drain output (i.e., a voltage V3). In addition, the VIN signal represents the power-supply level V1 to block. The output of the VCO logic continues to control the VCO block labeled VCO2. In this schematic, compared to FIG. 17, a VCO Logic block and a voltage source block VSRC provide the voltage VLEV to the input VA of a charge-pump array. Furthermore, the circuit diagram in FIG. 18 is operated such that the voltages V1, V3, and V2 of the N/M comparator can correspond to the voltage VIN, VOUT, and PCP (the output of the charge-pump array 106).

Figure 19:
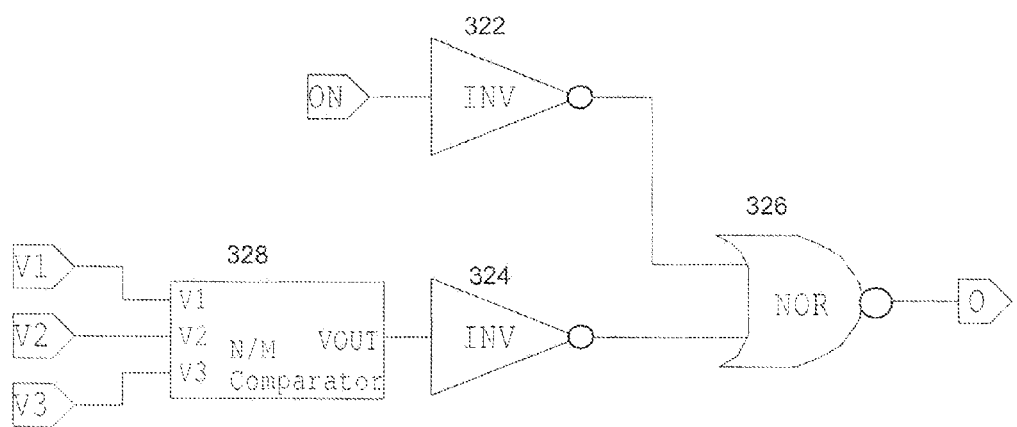
FIG. 19 illustrates a schematic of a VCO logic block using a comparator of the present invention.

FIG. 19 illustrates a schematic of a VCO logic block using a comparator of the present invention. An N/M comparator block 328 can have input voltages V1, V2, and V3 and an output voltage VOUT, which is inputted to an inverter 324. The N/M comparator 328 can be implemented using any comparator of the present invention (e.g., a comparator illustrated in FIG. 1), a combination comparator of the present invention (e.g., combination comparators illustrated in FIG. 15 and FIG. 16), or other comparators of the present invention.

In terms of operation, an ON signal can be inputted to an inverter 322. A NOR gate 326 receives inputs from the output of the inverter 322 and the inverter 324. The output of the NOR gate 326 is an output signal O. When the voltage V2 exceeds the comparator's threshold or trip point, the output signal O can, by design, turn off a charge pump (e.g., the charge pump illustrated in FIG. 18) or any other device.

Figure 20:
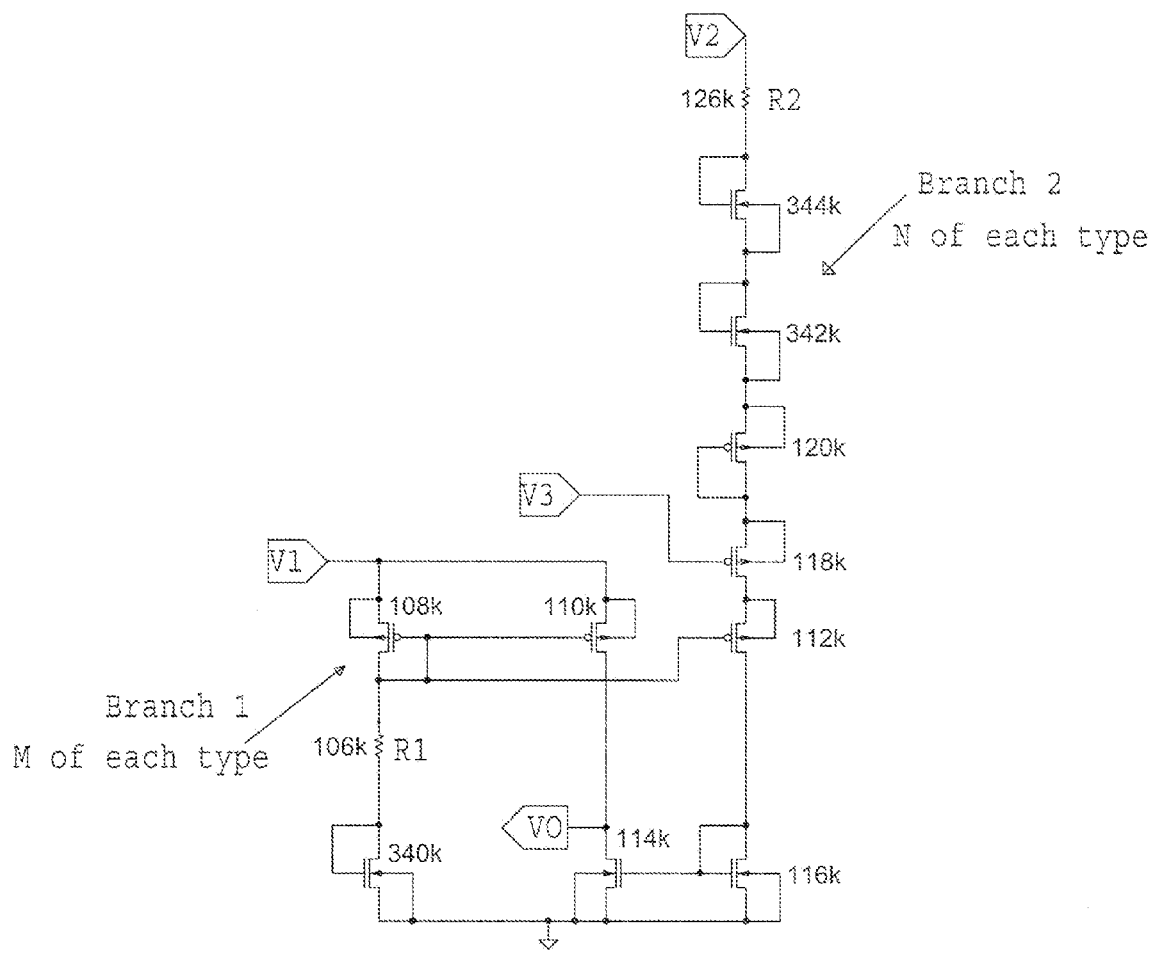
FIG. 20 illustrates another circuit diagram of an N/M comparator of the present invention.

FIG. 20 illustrates another circuit diagram of an N/M comparator of the present invention. A first branch 1 comprises an NMOS 340$k$ and a PMOS 108$k$. The body-connected source of the NMOS 340$k$ is connected to ground while its gate-connected drain is connected to an end of a resistor R1 106$k$. The other end of the resistor R1 106$k$ is connected to the gate-connected drain of the PMOS 108$k$. The body-connected source of the PMOS 108$k$ is connected to a voltage V1.

A second branch 2 is connected with a voltage V2. A string of two NMOS devices 344$k$ and 342$k$ and two PMOS devices 120$k$ and 118$k$ are connected between the voltage V2 and the PMOS 112$k$. The body-connected source of the NMOS 342$k$ is connected to the body-connected source of the PMOS 120$k$; the body-connected source of the NMOS 344$k$ is connected to the gate and the drain of the NMOS 342$k$. One end of a resistor R2 126$k$ is connected to the voltage V2 and another end of the resistor R2 126$k$ is connected to the gate and drain of the NMOS 344$k$. The PMOS devices 120$k$, 118$k$, 108$k$, 110$k$, and 112$k$ are matched. The voltage V3 is applied to the gate of the PMOS 118$k$. Also, the NMOS 114$k$ and the NMOS 116$k$ are connected to form a matched current mirror; and the PMOS 108$k$ and PMOS 110$k$ are connected to form another matched current mirror. The two current mirrors are connected, where their connection has an output voltage VO.

The circuit can be operated in a manner similar to the N/M-comparator circuit illustrated in FIG. 12. Referring to FIG. 20, a goal is to match the net voltage drop in the first branch 1, which includes the resistor R1 106$k$, with the net voltage drop in the second branch 2, which includes the resistor R2 126$k$, in such a way that when the voltages are equal, the current in the PMOS 110$k$ can equal the current in the NMOS 114$k$.

For instance, the following can be assumed: in the first branch 1, there are M PMOS transistors and M NMOS transistors, where M is a number; in the second branch 2, there are N PMOS transistors and N NMOS transistors, where N is a number; all PMOS transistors are matched and all NMOS transistors are matched; and M times the value of the resistance of the resistor R2 126$k$ is equal to N times the value of the resistance of the resistor R1 106$k$. Then under these conditions, the currents of the current mirrors are equal when the voltage V2 equals N/M times the voltage V1 plus the voltage V3. In other words, the trip point can be given by Equation (6).

Figure 21:
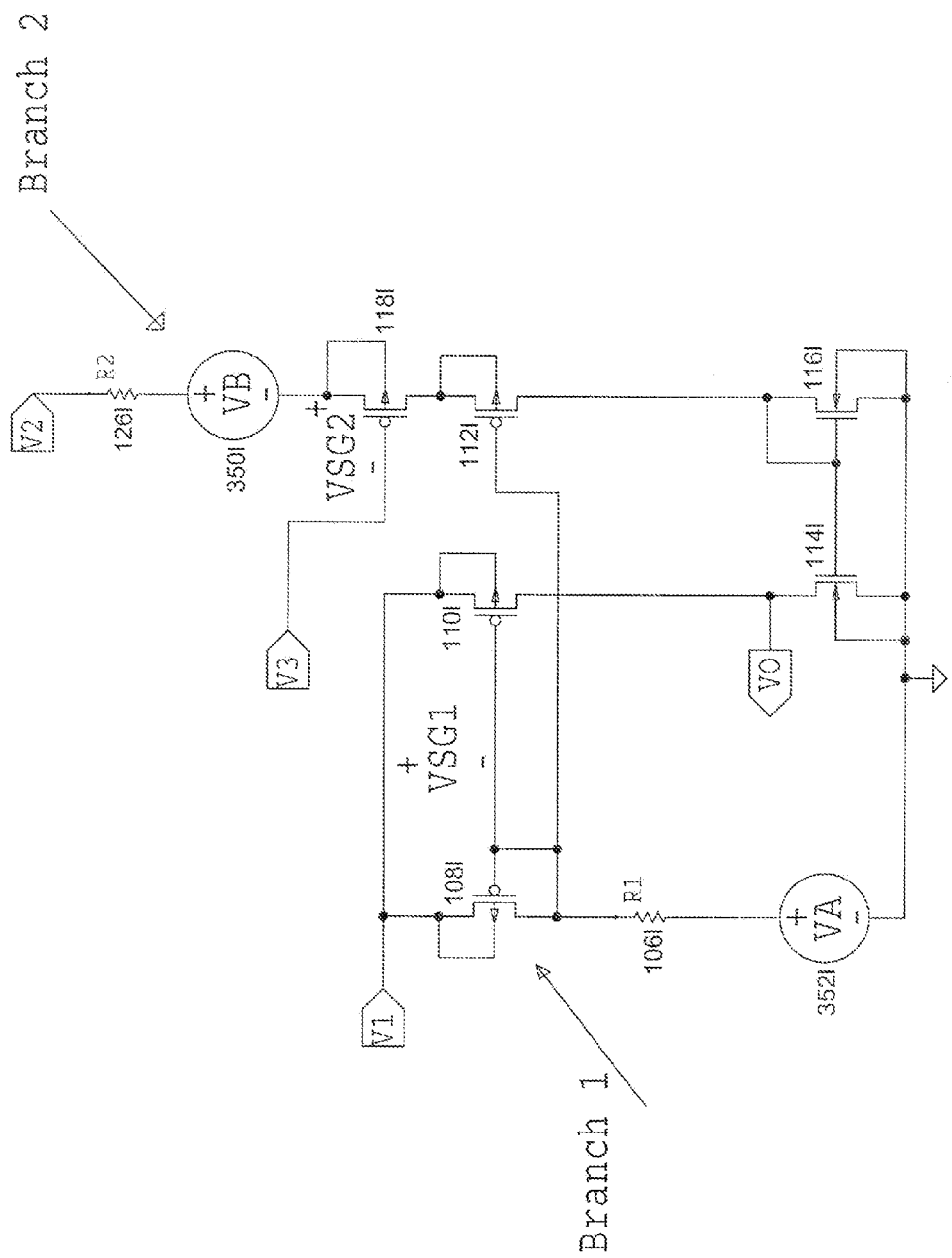
FIG. 21 illustrates a circuit diagram of a generalization of a comparator of the present invention.

FIG. 21 illustrates a circuit diagram of a generalization of a comparator of the present invention. The connections are similar to that of FIG. 20, except here there are two replacements to generalize the circuit illustrated in FIG. 20. Referring to FIG. 21, a voltage source VA 3521 replaces an NMOS 340$k$ in the first branch 1 of the circuit illustrated in FIG. 20, and a voltage source VB 3501 replaces transistors PMOS 120$k$, NMOS 342$k$, and NMOS 344$k$ in the second branch 2 of the circuit in FIG. 20. The voltage source VA 3521 is connected between a resistor R1 1061 and ground, while the voltage source VB 3501 is connected between the body-connected source of a PMOS 1181 and one end of a resistor R2 1261. For reference, the gate-to-source voltage of the PMOS 1081 is drawn as VSG1 while the gate-to-source voltage of the PMOS 1181 is drawn as VSG2.

If the voltage sources VA 3521 and VB 3501 are current dependent voltage sources, such as diode-connected MOS transistors, then there is a condition upon which the first branch 1 and the second branch 2 can be designed to force the current in the PMOS 1101 to equal the current in the NMOS 1141 at a transition or trip-point condition given by the voltage V2 equal to N/M times the voltage V1 plus the voltage V3. In this case, the design condition can be written as the sum of the voltages VA 3521 and VSG1 times the value of the resistance of the resistor R2 1261 is equal to the sum of the voltages VB 3501 and VSG2 times the value of the resistance of the resistor R1 1061. The voltages VSG1 and VSG2 can be defined by the source-to-gate voltage of the PMOS 1081 and PMOS 1181, respectively.

The idea of extending the useful lower voltage range of level V1 illustrated in FIG. 16 can be applied to any combination of N/M comparators. For instance, it can be applied to the design of a single N/M comparator where N and M are equal to or greater than one. This technique can be especially useful when the number of devices or elements, M, in the branch containing the resistor R1, is greater than one. This technique and permutations can be obvious to the circuit design engineer in view of the disclosure of the present invention. As such, the claims encompass these various embodiments of the present invention.

While this comparator finds use in positive charge-pump load-switch applications, it may be used as a general circuit comparator in many applications. For instance in negative rail embodiments, a negative V2 rail embodiment can also follow a similar equation to that disclosed above, however, the polarity will be opposite. In other words, the output trip point is now given by $$V2=-(R2/R1)V1+V3 \tag{7}$$

where V1 is understood to be positive. By design, the voltage V2 can be a negative number since the voltage V2 is lower than ground.

Figure 22:
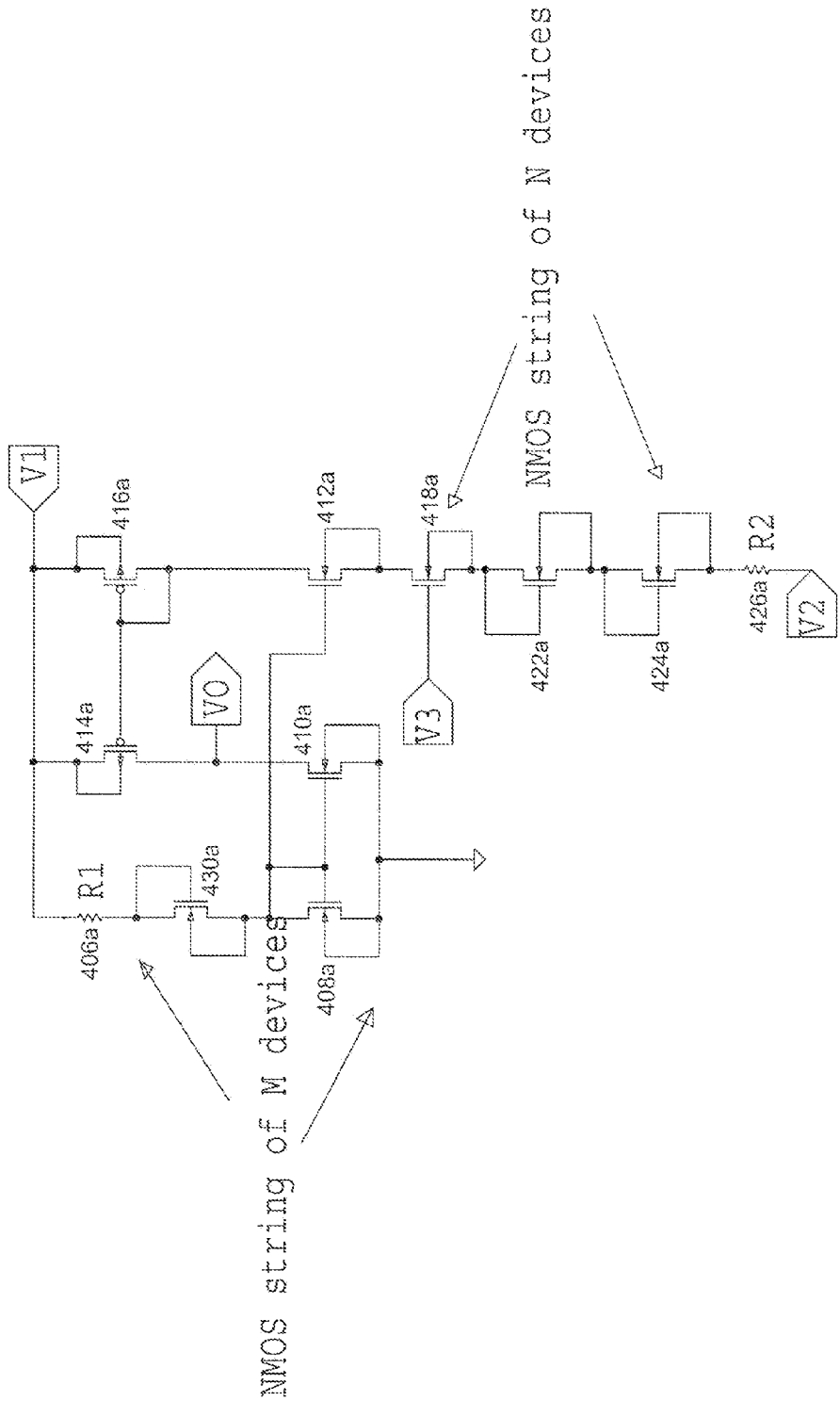
FIG. 22 illustrates a circuit diagram of a comparator of the present invention for comparing a scaled multiple of a voltage V2 to another voltage V1, where the voltage V2 is a negative voltage.

FIG. 22 illustrates a circuit diagram of a comparator of the present invention for comparing a scaled multiple of a voltage V2 to another voltage V1, where the voltage V2 is a negative voltage. The comparator uses a general technique of the present invention for realizing a non-integer scale factor and also comparing the voltages V2 and V1 relative to a third voltage V3. Thus, the trip point is given by Equation (7).

In terms of connections, the body-connected source of a PMOS 416a is connected to a voltage V1 while its gate and drain are both connected to the drain of an NMOS 412a. The NMOS devices 408a and 410a form a current mirror; and PMOS devices 414a and 416a form another current mirror. The drain of the NMOS 410a and the drain of the PMOS 414a are connected and have an output voltage VO. The body-connected source of the NMOS 412a is connected to the drain of an NMOS 418a, and the NMOS 412a is matched to the NMOS 410a and the NMOS 408a. The NMOS devices 418a, 422a, and 424a form a string of matched devices connected in series. In general, any number N of NMOS devices may be connected in series as needed.

Each NMOS from the set of NMOS devices 418a, 422a, and 424a, has its body connected to its respective source. The gate of the NMOS 418a is connected to the voltage V3 and its body-connected source is connected to the drain and gate of the NMOS 422a. The gate and drain of the NMOS 424a are connected to the body-connected source of 422a. The body-connected source of the NMOS 424a is connected to an end of a resistor R2 426a. The other end of the resistor R2 426a is connected to the voltage V2. The NMOS devices 408a and 430a form another string of matched devices connected in series. In general, any number, M, of NMOS devices may be connected in series as drawn. Each NMOS device from the set of NMOS devices 408a and 430a has its body connected to its respective source and its gate connected to its respective drain. The final NMOS in the chain, NMOS 430a, has its drain and gate connected to an end of the resistor R1 406a. The other end of the resistor R1 406a is connected to the voltage V1.

By connecting the voltage V3 to the gate of the NMOS 418a, the condition for a transition also becomes dependent upon the voltage V3. Given the matching conditions, a transition now occurs when a negative times the resistance of R2/R1 times the voltage V1 plus the voltage V3 is equal to the voltage V2. In addition to the VGS matching conditions as outlined in the description of FIG. 8, there is also an operating point condition placed upon the NMOS 418a. The trip point holds when the NMOS 418a operates in the active or MOS saturation region. Those familiar with MOS operation understand the saturation versus linear region operation of MOS transistors. If the NMOS device 418a enters the linear region, then the condition for the trip point is modified. An advantage to connecting the voltage V3 to the gate of the NMOS 418a is that the gate of the respective load switch can always be protected with reference to the source potential.

Figure 23:
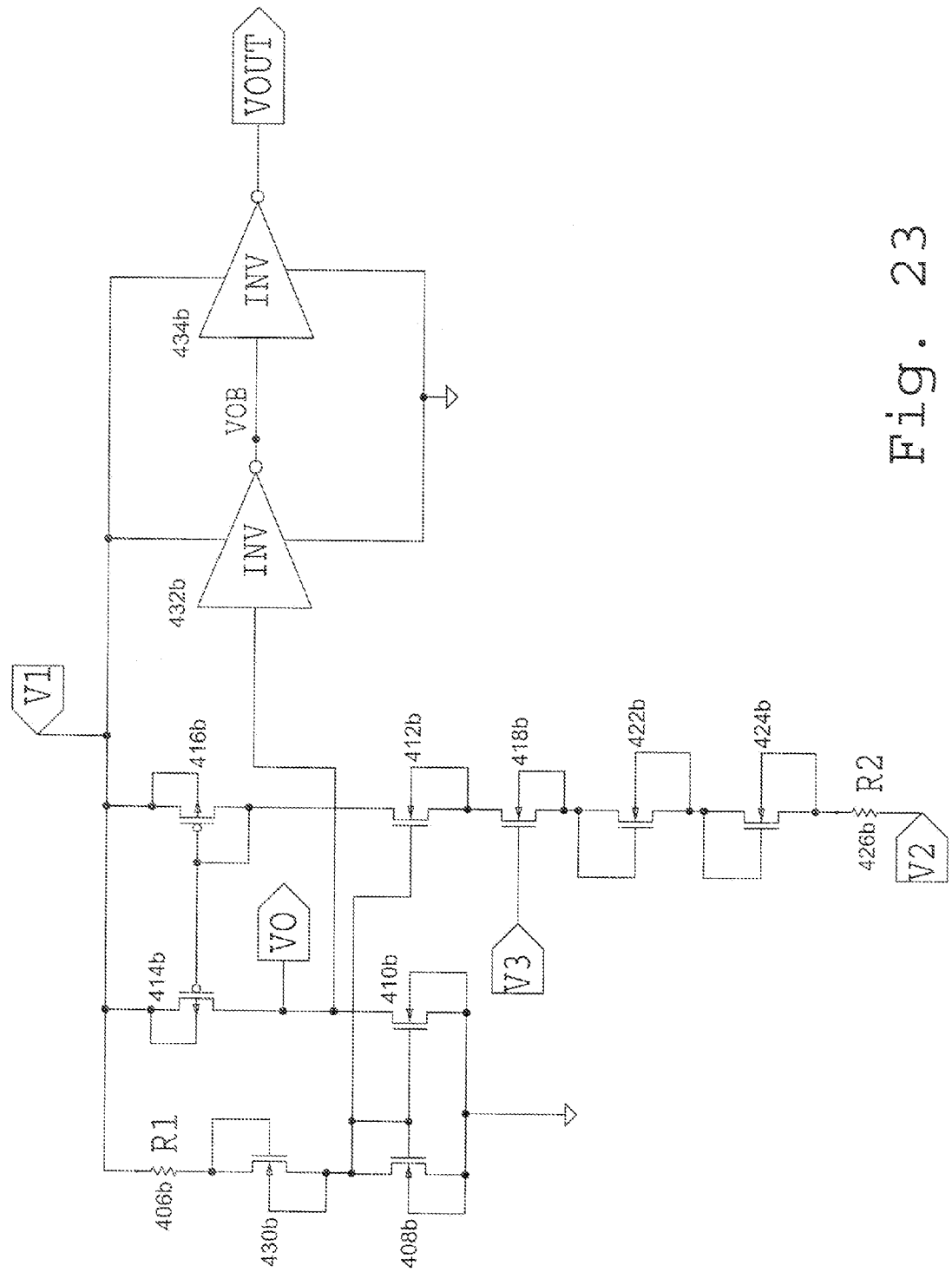
FIG. 23 illustrates a circuit diagram for a comparator with a buffering mechanism of the present invention for comparing a negative voltage.

FIG. 23 illustrates a circuit diagram for a comparator with a buffering mechanism of the present invention for comparing a negative voltage. Similar in concept to the circuit diagram illustrated in FIG. 22, this embodiment includes buffering. An NMOS string of matched devices comprises NMOS devices 418b, 422b, and 424b. The drain of the NMOS 424b is connected to a resistor R2 426b. The other end of the resistor R2 426b is connected to a voltage V2. Notice the other NMOS string of matched devices comprises two NMOS devices 408b and 430b. Similarly to other embodiments, the PMOS devices 414b and 416b form a matched current mirror; the NMOS devices 408b and 410b form another matched current mirror. The drain of the PMOS 414b is connected to the drain of the NMOS 410b, where the connection has an output voltage VO. Also the NMOS devices 408b, 410b, 412b, 418b, 422b, 424b, and 430b are matched. Buffering is implemented by connecting two inverters 432b and 434b in series to the output voltage VO. The voltage V1 and ground are also inputted to the inverters 432b and 434b. Note that the voltage V3 is connected to the gate of the NMOS 418b.

Figure 24:
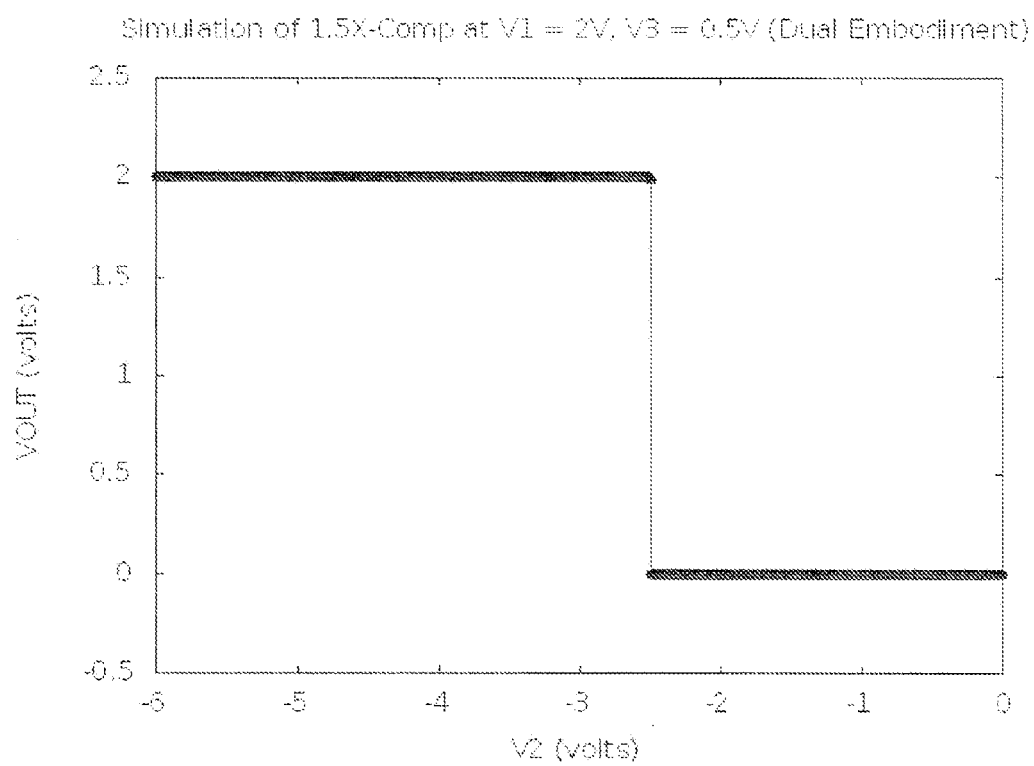
FIG. 24 illustrates a graphical simulation of DC-characteristics of a 1.5× comparator of the present invention for comparing a negative voltage.

FIG. 24 illustrates a graphical simulation of DC-characteristics of a 1.5× comparator of the present invention for comparing a negative voltage. In this case, the circuit diagram illustrated in FIG. 23 can be used for the purposes of the simulation, where the following values are given: the PMOS devices have a channel width equal to 8 μm (microns) and a channel length equal to 4 μm; the NMOS devices have a channel width equal to 6 μm and a channel length equal to 3 μm; the resistor R1 406b is equal to 2 mega-ohms and the resistor R2 426b is equal to 3 mega-ohms. The simulation is the result of a DC-sweep using common 0.35 μm device models. The plot illustrates the voltage VOUT versus the voltage V2 when the voltage V1 is equal to 2 volts and the voltage V3 is equal to 0.5 volt. The transition point is when the voltage V2 equals −2.5 volts, which agrees with theory.

Figure 25:
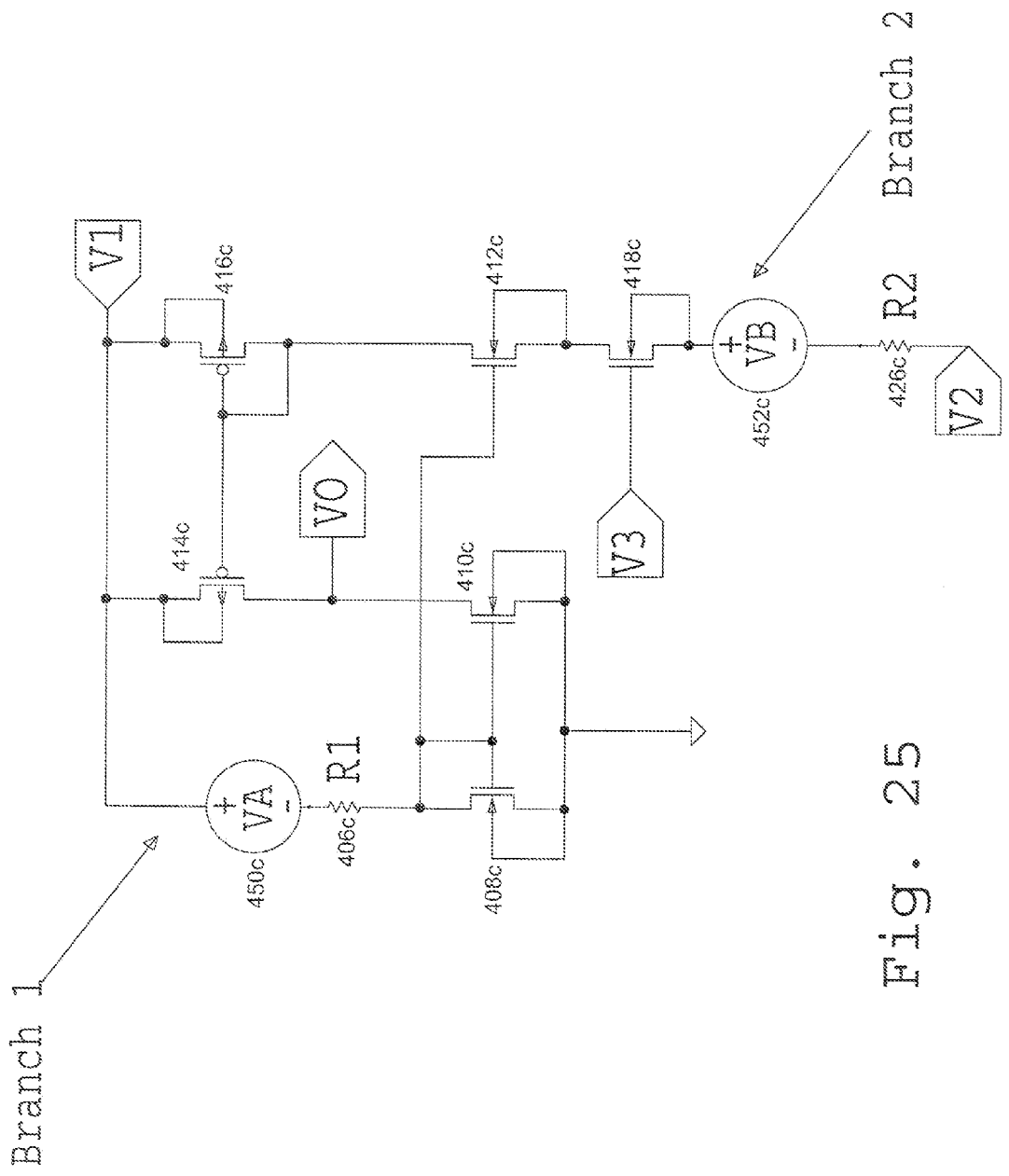
FIG. 25 illustrates a circuit diagram of a generalization of a comparator of the present invention for comparing a negative voltage.

FIG. 25 illustrates a circuit diagram of a generalization of a comparator of the present invention for comparing a negative voltage. The connections are similar to that of FIG. 22, except here there are two replacements to generalize the circuit illustrated in FIG. 22. Referring to FIG. 25, a voltage source VA 450c replaces an NMOS 430a in the first branch 1 of the circuit illustrated in FIG. 22, and a voltage source VB 452c replaces NMOS devices 422a, and 424a in the second branch 2 of the circuit in FIG. 22. The voltage source VA 450c is connected between a resistor R1 406c and a voltage V1, while the voltage source VB 452c is connected between the body-connected source of the NMOS 418c and one end of a resistor R2 426c.

If the voltage sources VA 450c and VB 452c are current dependent voltage sources, such as diode-connected MOS transistors, then there is a condition upon which the first branch 1 and the second branch 2 can be designed to force the current in the NMOS 410c to equal the current in the PMOS 414c at a transition or trip-point condition. In this case, the design condition can be written as the sum of the voltages VA 450c and VSG1 times the value of the resistance of the resistor R2 426c is equal to the sum of the voltages VB 452c and VSG2 times the value of the resistance of the resistor R1 406c, i.e., $$(VA+VSG1)R2=(VB+VSG2)R1. \quad (8)$$

The voltages VSG1 and VSG2 can be defined by the source-to-gate voltage of the NMOS 408c and NMOS 418c, respectively.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

I claim:

1. A voltage comparator, comprising:
   a first branch comprising a first transistor, a first resistor (R1), and a first current dependent voltage source (VA), wherein a first voltage (V1) is applied across the first branch to generate a first current and wherein the first transistor is a diode-connected transistor;

a second branch comprising a second resistor (R2), a second current dependent voltage source (VB), and a second transistor having a control voltage (V3), wherein a second voltage (V2) is applied on an end of the second branch to generate a second current; and a third branch for generating a comparator output, wherein a trip point of the comparator output is set to when the first current and the second current are equal and wherein the trip point is a function of the transistors, the resistors, and the current dependent voltage sources of the first branch and the second branch.

2. The voltage comparator of claim 1 wherein a relationship between the first branch and the second branch is given by $(VA+Vgs1) \times R2 = (VB+Vgs2) \times R1$, wherein the voltage Vgs1 is the gate-to-source voltage of the first transistor and the voltage Vgs2 is the gate-to-source voltage of the second transistor.

3. The voltage comparator of claim 1 further comprising a first current mirror, a second current mirror, and a third transistor, wherein the first transistor, the first resistor, and the first current dependent voltage source are connected in series, the second resistor, the second current dependent voltage source, the second transistor, and the third transistor are connected in series, the voltage V3 is applied to the gate of the second transistor, the gate of the third transistor is connected to the first current mirror and the drain of the first transistor, the drain of the third transistor is connected to the second current mirror, the first current mirror is connected to the first branch and the third branch and mirrors the first current in the third branch, and the second current mirror is connected to the second branch and third branch and mirrors the second current in the third branch.

4. The voltage comparator of claim 1 wherein the first current dependent voltage source comprises a first number of transistors, wherein the second current dependent voltage source comprises a second number of transistors, wherein the transistors in the first branch and the second branch are matched, and wherein the resistors in the first branch and the second branch are matched.

5. The voltage comparator of claim 4 further comprising a first current mirror, a second current mirror, and a third transistor, wherein the transistors in the first branch and the first resistor are connected in series, the transistors in the second branch, the third transistor, and the second resistor are connected in series, the voltage V3 is applied to the gate of the second transistor, the gate of the third transistor is connected to the first current mirror and the drain of the first transistor, the drain of the third transistor is connected to the second current mirror, the first current mirror is connected to the first branch and the third branch and mirrors the first current in the third branch, and the second current mirror is connected to the second branch and third branch and mirrors the second current in the third branch.

6. The voltage comparator of claim 4 wherein the first number of transistors plus one is M and the second number of transistors plus one is N, and wherein the matched relationship between the first branch and the second branch is given by $M \times R2 = N \times R1$.

7. The voltage comparator of claim 6 wherein the transistors are PMOS devices and wherein the trip point is $V2=(N/M)*V1+V3$.

8. The voltage comparator of claim 6 wherein the transistors are NMOS devices and wherein the trip point is $V2=-(N/M)*V1+V3$.

9. A voltage comparator, comprising:

a first branch comprising a first transistor, a first resistor (R1), and a first current dependent voltage source (VA), wherein the first transistor, the first resistor, and the first current dependent voltage source are connected in series, wherein a first voltage (V1) is applied across the first branch to generate a first current and wherein the first transistor is a diode-connected transistor;

a second branch comprising a second resistor (R2), a second current dependent voltage source (VB), a second transistor, and a third transistor, wherein the second resistor, the second current dependent voltage source, the second transistor, and the third transistor are connected in series, wherein a control voltage (V3) is applied to the gate of the second transistor, and wherein a second voltage (V2) is applied on an end of the second branch to generate a second current;

a third branch for generating a comparator output;

a first current mirror, wherein the first current mirror is connected to the first branch and the third branch and mirrors the first current in the third branch; and a second current mirror, wherein the second current mirror is connected to the second branch and third branch and mirrors the second current in the third branch, wherein the gate of the third transistor is connected to the first current mirror and the drain of the first transistor, wherein the drain of the third transistor is connected to the second current mirror, wherein a trip point of the comparator output is set to when the first current and the second current are equal, and wherein the trip point is a function of the transistors, the resistors, and the current dependent voltage sources of the first branch and the second branch.

10. The voltage comparator of claim 9 wherein a relationship between the first branch and the second branch is given by $(VA+Vgs1) \times R2 = (VB+Vgs2) \times R1$, wherein the voltage Vgs1 is the gate-to-source voltage of the first transistor and the voltage Vgs2 is the gate-to-source voltage of the second transistor.

11. The voltage comparator of claim 9 wherein the first current dependent voltage source comprises a first number of transistors, wherein the second current dependent voltage source comprises a second number of transistors, wherein the transistors in the first branch and the second branch are matched and connected in series, and wherein the resistors in the first branch and the second branch are matched.

12. The voltage comparator of claim 11 wherein the first number of transistors plus one is M and the second number of transistors plus one is N, and wherein the matched relationship between the first branch and the second branch is given by $M \times R2 = N \times R1$.

13. The voltage comparator of claim 12 wherein the transistors are PMOS devices and wherein the trip point is $V2=(N/M)*V1+V3$.

14. The voltage comparator of claim 12 wherein the transistors are NMOS devices and wherein the trip point is $V2=-(N/M)*V1+V3$.

15. A voltage comparator, comprising:
a first branch comprising a first transistor, a first resistor (R1), and a first current dependent voltage source (VA), wherein the first transistor, the first resistor, and the first current dependent voltage source are connected in series, wherein a first voltage (V1) is applied across the first branch to generate a first current, wherein the first transistor is a diode-connected transistor, and wherein the first current dependent voltage source comprises a first number of transistors connected in series;
a second branch comprising a second resistor (R2), a second current dependent voltage source (VB), a second transistor, and a third transistor, wherein the second resistor, the second current dependent voltage source, the second transistor, and the third transistor are connected in series, wherein a control voltage (V3) is applied to the gate of the second transistor, wherein a second voltage (V2) is applied on an end of the second branch to generate a second current, and wherein the second current dependent voltage source comprises a second number of transistors connected in series;
a third branch for generating a comparator output;
a first current mirror, wherein the first current mirror is connected to the first branch and the third branch and mirrors the first current in the third branch; and
a second current mirror, wherein the second current mirror is connected to the second branch and third branch and mirrors the second current in the third branch;
wherein a relationship between the first branch and the second branch is given by $(VA+Vgs1) \times R2 = (VB+Vgs2) \times R1$, where the voltage Vgs1 is the gate-to-source voltage of the first transistor and the voltage Vgs2 is the gate-to-source voltage of the second transistor,
wherein the first number of transistors plus one is M and the second number of transistors plus one is N,
wherein the transistors in the first branch and the second branch are matched,
wherein the resistors in the first branch and the second branch are matched,
wherein the matched relationship between the first branch and the second branch is given by $M \times R2 = N \times R1$,
wherein the gate of the third transistor is connected to the first current mirror and the drain of the first transistor,
wherein the drain of the third transistor is connected to the second current mirror,
wherein a trip point of the comparator output is set to when the first current and the second current are equal, and
wherein the trip point is a function of the transistors, the resistors, and the current dependent voltage sources of the first branch and the second branch.

16. The voltage comparator of claim 15 wherein the transistors are PMOS devices and wherein the trip point is $V2 = (N/M)*V1+V3$.

17. The voltage comparator of claim 15 wherein the transistors are NMOS devices and wherein the trip point is $V2 = -(N/M)*V1+V3$.

* * * * *